US009666665B2

(12) United States Patent
Laven et al.

(10) Patent No.: US 9,666,665 B2
(45) Date of Patent: May 30, 2017

(54) SEMICONDUCTOR DEVICE WITH SEMICONDUCTOR MESA INCLUDING A CONSTRICTION

(71) Applicant: Infineon Technologies AG, Neubiberg (DE)

(72) Inventors: Johannes Georg Laven, Taufkirchen (DE); Roman Baburske, Otterfing (DE); Matteo Dainese, Villach (AT); Peter Lechner, Holzkirchen (DE)

(73) Assignee: Infineon Technologies AG, Neubiberg (DE)

( * ) Notice: Subject to any disclaimer, the term of this patent is extended or adjusted under 35 U.S.C. 154(b) by 649 days.

(21) Appl. No.: 14/248,371

(22) Filed: Apr. 9, 2014

(65) Prior Publication Data

US 2015/0295034 A1    Oct. 15, 2015

(51) Int. Cl.
  *H01L 29/66*       (2006.01)
  *H01L 29/06*       (2006.01)
  *H01L 29/739*      (2006.01)
  *H01L 29/423*      (2006.01)
  *H01L 29/40*       (2006.01)
  *H01L 29/08*       (2006.01)

(52) U.S. Cl.
  CPC ...... *H01L 29/0619* (2013.01); *H01L 29/0623* (2013.01); *H01L 29/0696* (2013.01); *H01L 29/0834* (2013.01); *H01L 29/407* (2013.01); *H01L 29/4236* (2013.01); *H01L 29/42376* (2013.01); *H01L 29/66325* (2013.01); *H01L 29/66333* (2013.01); *H01L 29/66348* (2013.01); *H01L 29/7395* (2013.01); *H01L 29/7397* (2013.01)

(58) Field of Classification Search
  None
  See application file for complete search history.

(56) References Cited

U.S. PATENT DOCUMENTS

| | | | |
|---|---|---|---|
| 5,891,807 A | 4/1999 | Muller et al. | |
| 2015/0129895 A1* | 5/2015 | Takeuchi | H01L 29/4236 257/77 |

(Continued)

OTHER PUBLICATIONS

Sumitomo et al, "Low Loss IGBT with Partially Narrow Mesa Structure (PNM-IGBT)," IEEE, Proceedings of the 2012 23th International Symposium on Power Semiconductor Devices and ICs, Jun. 3-7, 2012, Bruges, Belgium, pp. 17-20.

(Continued)

*Primary Examiner* — Minh-Loan Tran
(74) *Attorney, Agent, or Firm* — Murphy, Bilak & Homiller, PLLC

(57) ABSTRACT

A semiconductor device includes a body zone in a semiconductor mesa, which is formed between neighboring control structures that extend from a first surface into a semiconductor body. A drift zone forms a first pn junction with the body zone. In the semiconductor mesa, the drift zone includes a first drift zone section that includes a constricted section of the semiconductor mesa. A minimum horizontal width of the constricted section parallel to the first surface is smaller than a maximum horizontal width of the body zone. An emitter layer between the drift zone and the second surface parallel to the first surface includes at least one first zone of a conductivity type of the drift zone.

23 Claims, 27 Drawing Sheets

(56) References Cited

U.S. PATENT DOCUMENTS

2015/0145028 A1* 5/2015 Laven .................. H01L 29/7813
257/330
2017/0018633 A1* 1/2017 Baburske ............ H01L 29/7395

OTHER PUBLICATIONS

Sumitomo et al, "Injection Control Technique for High Speed Switching with a Double Gate PNM-IGBT," Proceedings of the 25th International Symposium on Power Semiconductor Devices and ICs, pp. 33-36.

Laven et al, "Semiconductor Device with Cell Trench Structures and Contacts and Method of Manufacturing a Semiconductor Device," U.S. Appl. No. 13/963,312, filed on Aug. 9, 2013.

* cited by examiner

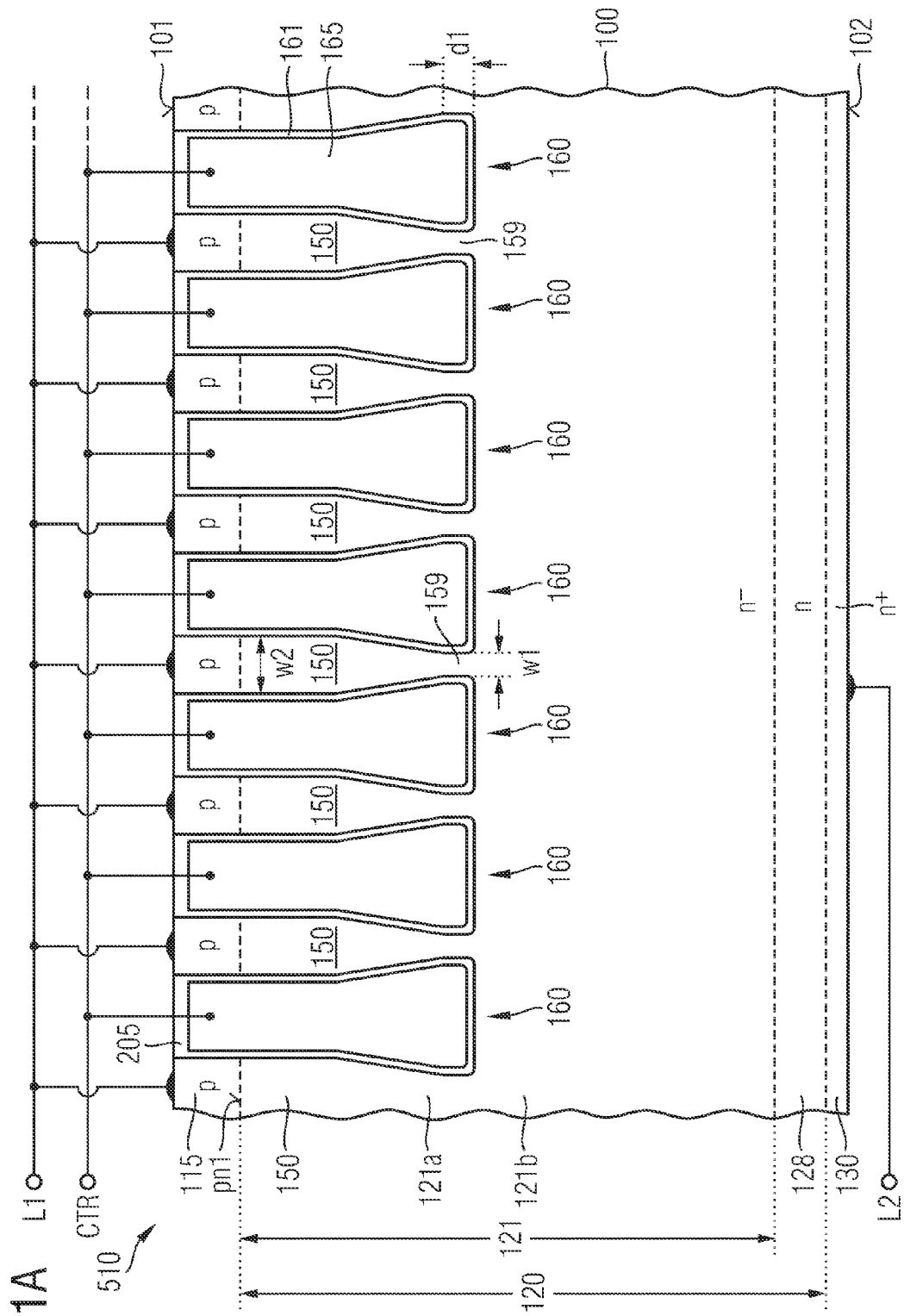

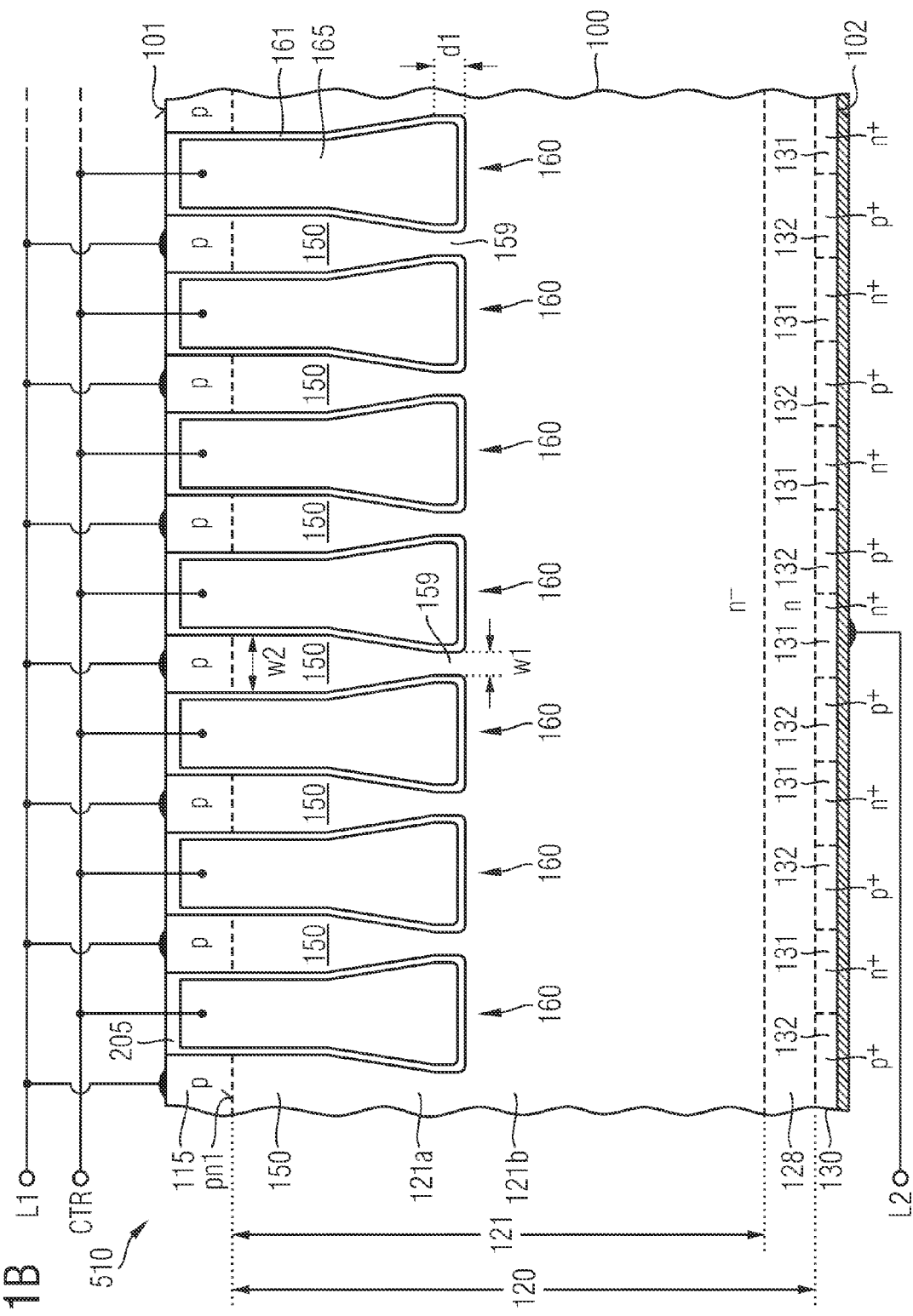

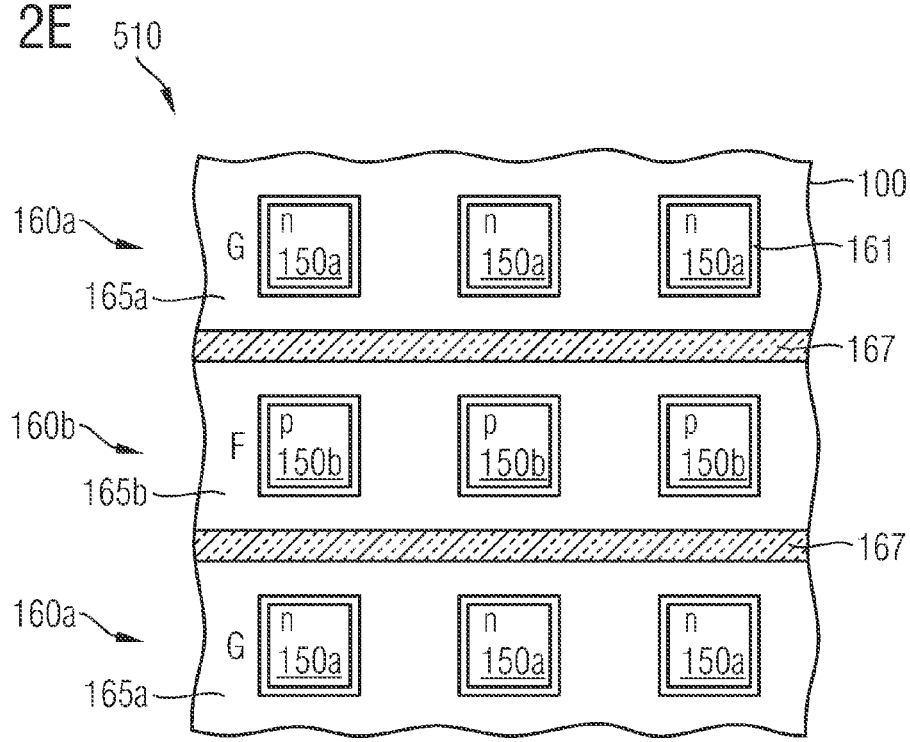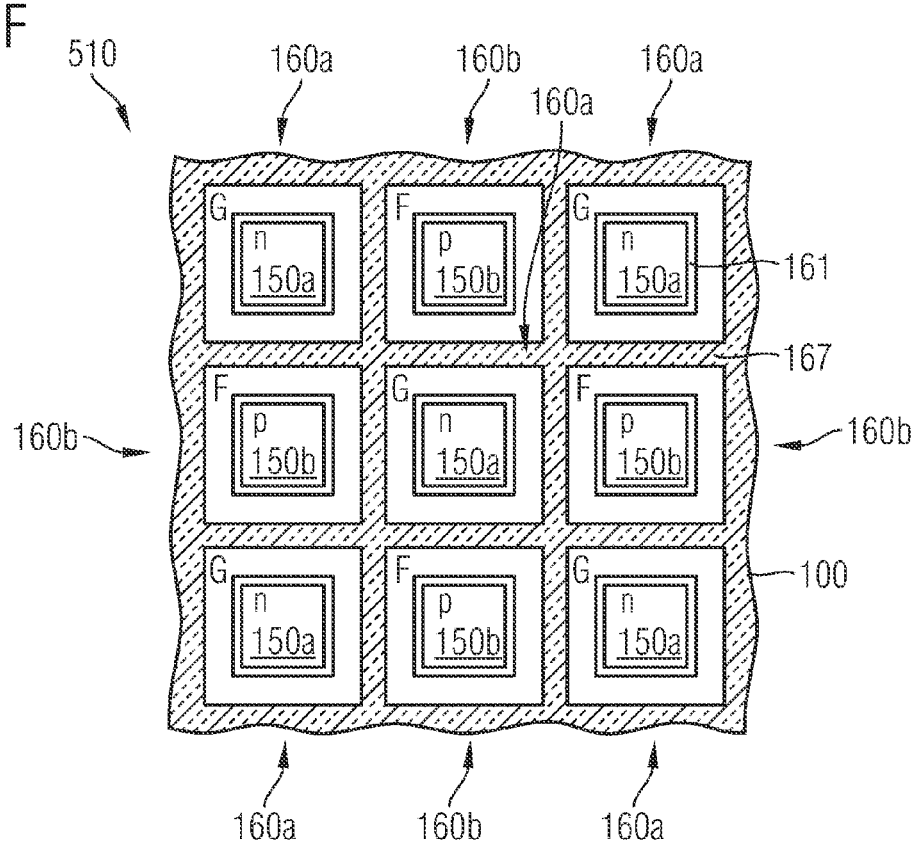

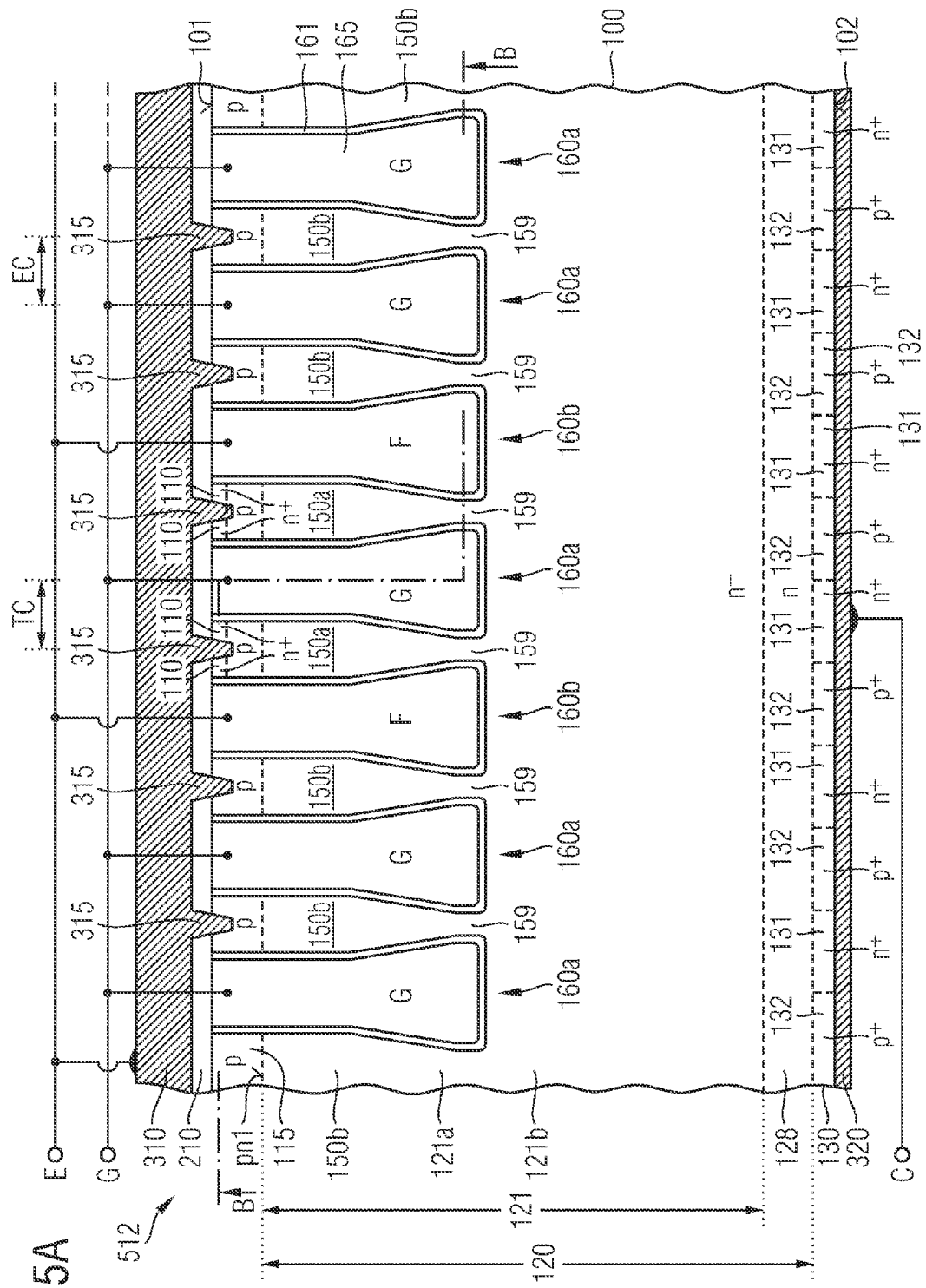

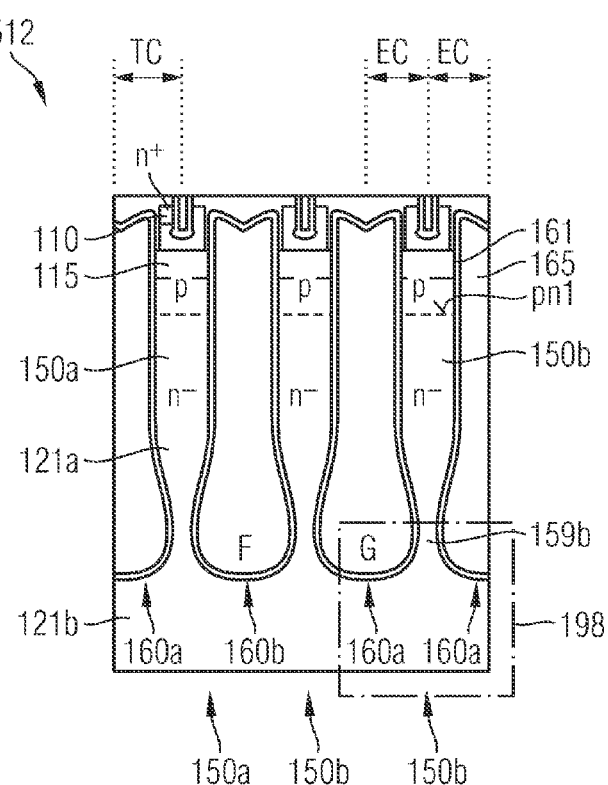
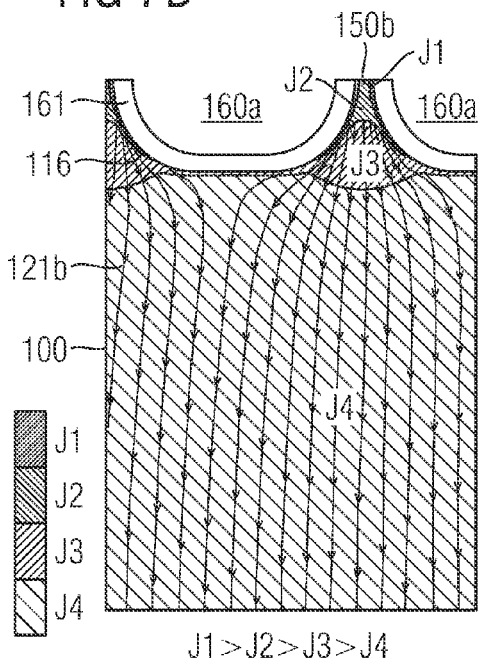
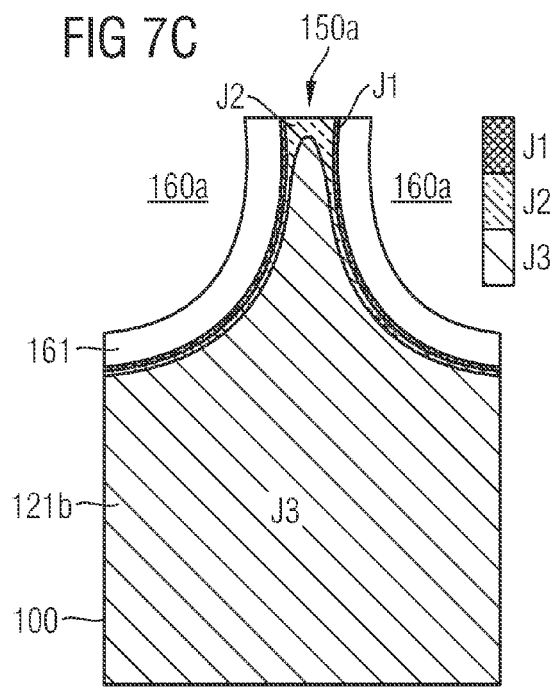

J1>J2>J3>J4

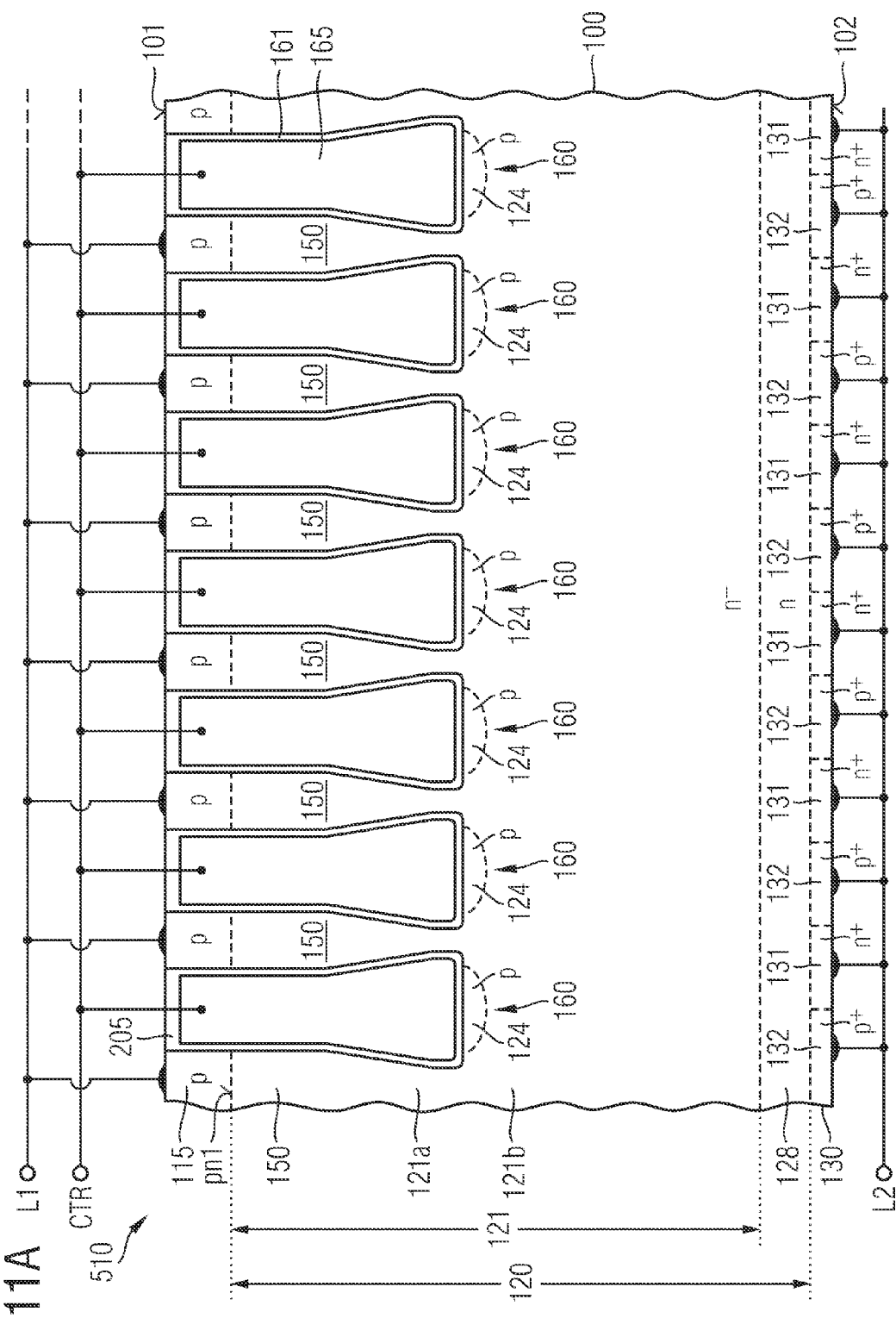

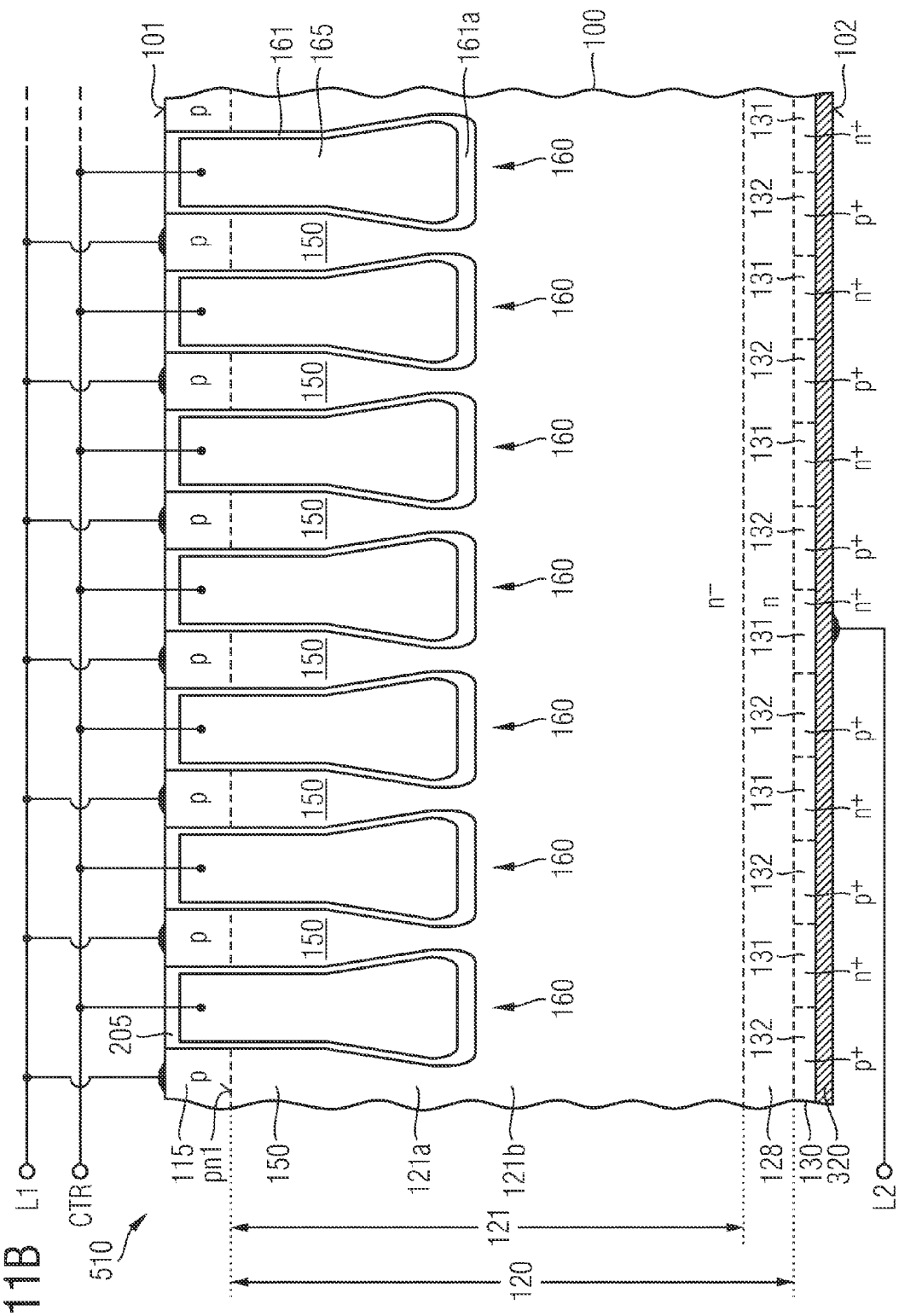

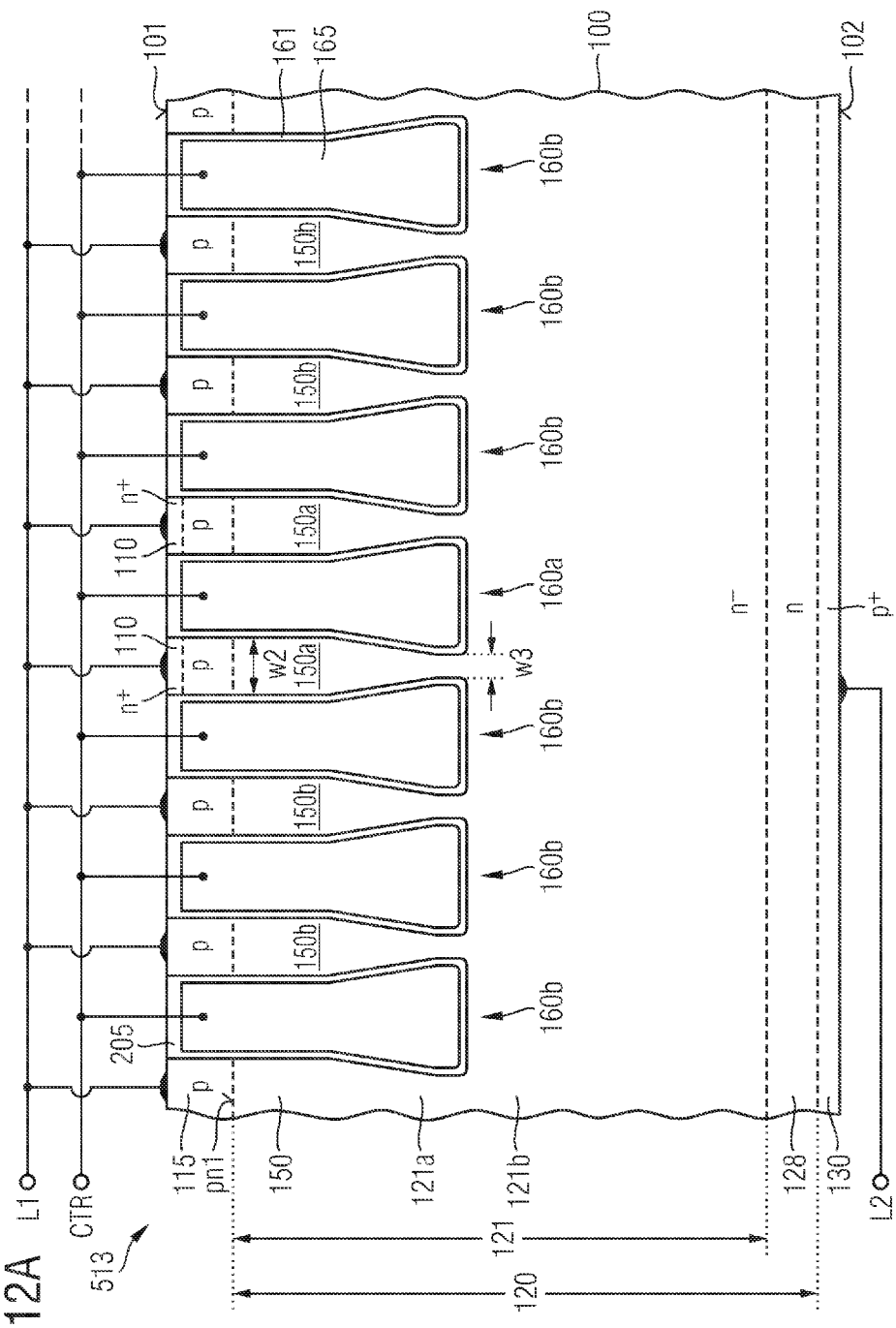

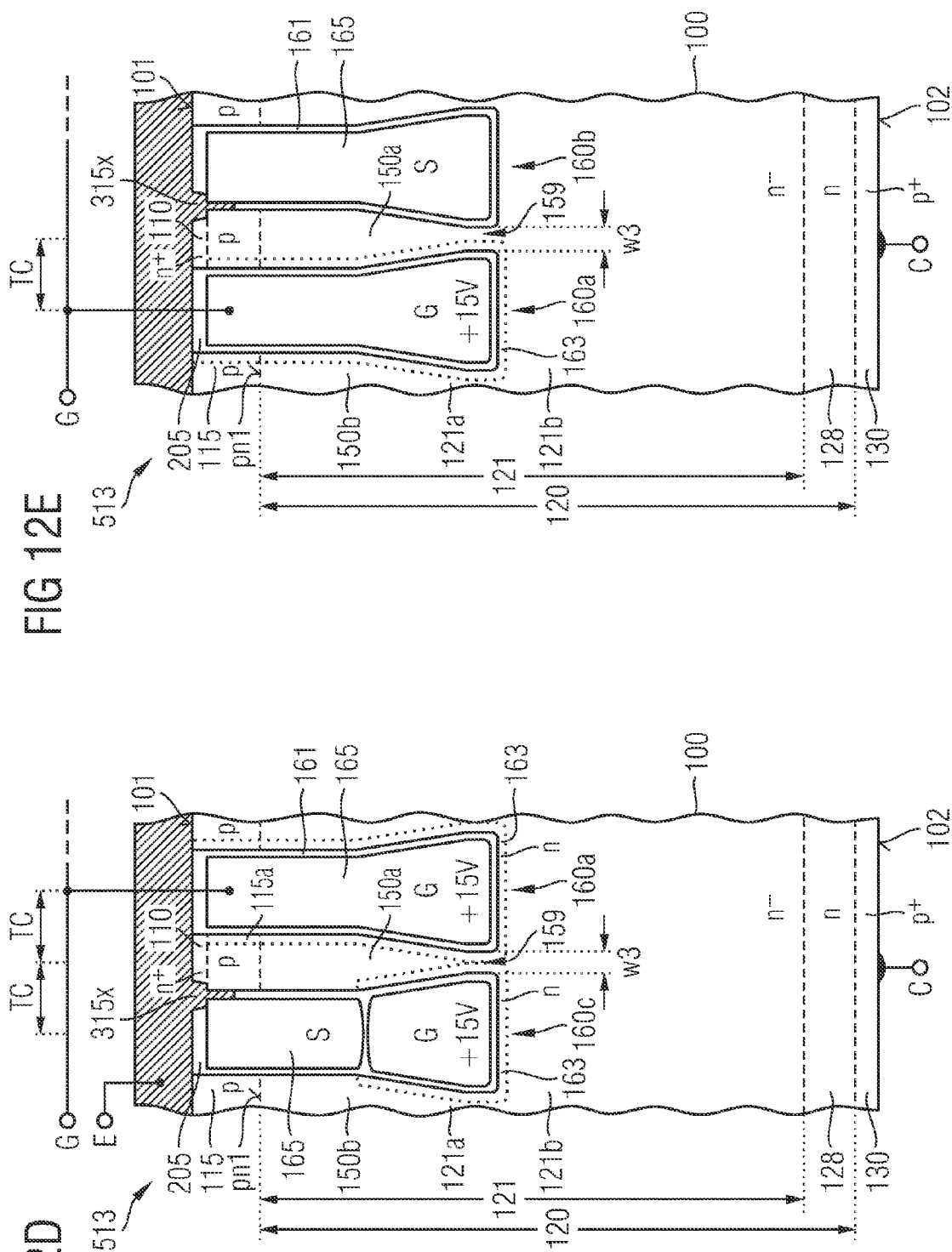

SEMICONDUCTOR DEVICE WITH SEMICONDUCTOR MESA INCLUDING A CONSTRICTION

BACKGROUND

In semiconductor diodes and semiconductor switching devices including a body diode like IGFETs (insulated gate field effect transistors) as well as RC-IGBTs (reverse conducting insulated gate bipolar transistors) mobile charge carriers may flood a semiconductor region along a forward biased pn junction and may form a dense charge carrier plasma that yields a low forward resistance of the semiconductor diode or body diode. The charge carrier plasma is removed in a reverse recovery period when the concerned pn junction changes from forward biased to reverse biased. The reverse recovery process contributes to the dynamic switching losses of the semiconductor device. Typically, a desaturation mechanism may attenuate the charge carrier plasma before switching the pn junction from forward biased to reverse biased in order to reduce the dynamic switching losses. It is desirable to provide semiconductor devices with improved switching characteristics.

SUMMARY

According to an embodiment a semiconductor device includes a body zone in a semiconductor mesa, which is formed between neighboring control structures that extend from a first surface into a semiconductor body. A drift zone forms a first pn junction with the body zone. In the semiconductor mesa the drift zone includes a first drift zone section that includes a constricted section of the semiconductor mesa. A minimum horizontal width of the constricted section parallel to the first surface is smaller than a maximum horizontal width of the body zone. An emitter layer between the drift zone and the second surface parallel to the first surface includes at least one first zone of a conductivity type of the drift zone.

According to another embodiment a semiconductor device includes a body zone in a semiconductor mesa, which is formed between neighboring control structures that extend from a first surface into a semiconductor body. A drift zone forms a first pn junction with the body zone and includes, in the semiconductor mesa, a first drift zone section that includes a constricted section of the semiconductor mesa. A minimum horizontal width of the constricted section parallel to the first surface is smaller than a maximum horizontal width of the body zone. The body zone separates a source zone from the drift zone and forms a second pn junction with the source zone. The minimum horizontal width is at most equal to a total width of accumulation layers in the constricted section, wherein the accumulation layers are formed along the control structures in a forward conductive mode during which charge carriers enter the drift zone through the body zone.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic cross-sectional view of a portion of a semiconductor device in accordance with an embodiment concerning desaturable semiconductor diodes and IGFETs.

FIG. 1B is a schematic cross-sectional view of a portion of a semiconductor device in accordance with an embodiment concerning desaturable semiconductor diodes and RC-IGBTs (reverse conducting IGBTs).

FIG. 2E is a schematic horizontal cross-sectional view of another semiconductor device according to an embodiment related to stripe-shaped first and second control structures alternatingly embedding stripes of isolated semiconductor mesas.

FIG. 2F is a schematic horizontal cross-sectional view of a further semiconductor device according to an embodiment related to first and second control structures embedding active and passive semiconductor mesas and arranged in a checkerboard pattern.

FIG. 5A is a schematic cross-sectional view of a portion of a semiconductor device according to an embodiment concerning an RC-IGBT.

FIG. 7A is a schematic cross-sectional view of a portion of a semiconductor device according to a further embodiment related to n-channel RC-IGBTs with a constricted semiconductor mesa.

FIG. 7B is a schematic diagram showing the hole current density distribution along the base of the constricted semiconductor mesa in FIG. 7A at −15 V.

FIG. 7C is a schematic diagram showing the electron density distribution along the base of the constricted semiconductor mesa in FIG. 7A at −15 V.

FIG. 11A is a schematic cross-sectional view of a portion of a semiconductor device according to an embodiment providing counter-doped islands in the vertical projection of control structures.

FIG. 11B is a schematic cross-sectional view of a portion of a semiconductor device in accordance with an embodiment with enhanced capacitive decoupling at a buried edge of control structures.

FIG. 12A is a schematic cross-sectional view of a portion of a semiconductor device according to an embodiment concerning a non-reverse conducting IGBT.

FIG. 12D is a schematic cross-sectional view of a portion of a semiconductor device according to an embodiment concerning a non RC-IGBT and a combined mesa/source electrode contact.

FIG. 12E is a schematic cross-sectional view of a portion of a semiconductor device according to a further embodiment concerning a non RC-IGBT with combined mesa/source electrode contacts.

DETAILED DESCRIPTION

Figure 2A:
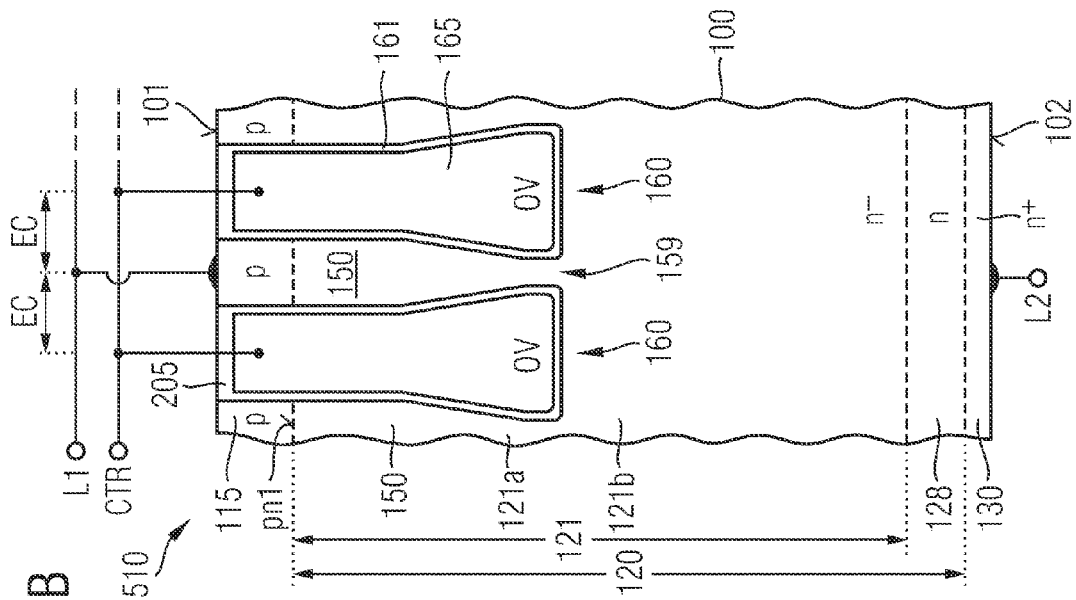
FIG. 2A is a schematic cross-sectional view of a portion of a semiconductor device according to an embodiment concerning a desaturable n-channel semiconductor device at a control voltage of −15 V for illustrating effects of the embodiments.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1A refers to a semiconductor device 510 whose emitter layer 130 has the same conductivity type as a drift zone 121. The semiconductor device 510 may be an IGFET (insulated gate field effect transistor) or a desaturable semiconductor diode.

A single-crystalline semiconductor material, for example silicon (Si), silicon carbide (SiC), germanium (Ge), a silicon germanium crystal (SiGe), gallium nitride (GaN), gallium arsenide (GaAs) or another $A_{11}B_V$ semiconductor forms a semiconductor body 100 with a first surface 101, which may be approximately planar or which may be defined by a plane spanned by coplanar surface sections, as well as a planar second surface 102 parallel to the first surface 101.

A minimum distance between the first and second surfaces 101, 102 depends on a voltage blocking capability the semiconductor device 500 is specified for. For example, the distance between the first and second surfaces 101, 102 may be in a range from 90 µm to 120 µm for a semiconductor device specified for a blocking voltage of about 1200 V. Other embodiments related to semiconductor devices with higher blocking capabilities may provide semiconductor bodies 100 with a thickness of several 100 µm. Semiconductor devices with low blocking capabilities may have a thickness from 35 µm to 90 µm.

In a plane parallel to the first surface 101 the semiconductor body 100 may have a rectangular shape with an edge length in the range of several millimeters. A normal to the first surface 101 defines a vertical direction and directions orthogonal to the vertical direction are horizontal directions.

The semiconductor body 100 includes a base region 120 that includes a drift zone 121 of a first conductivity type. A dopant concentration in the drift zone 121 may gradually or in steps increase or decrease with increasing distance to the first surface 101 at least in portions of its vertical extension. According to other embodiments the dopant concentration in the drift zone 121 may be approximately uniform. A mean dopant concentration in the drift zone 121 may be between $5E12\ cm^{-3}$ and $1E15\ cm^{-3}$, for example from $1E13\ cm^{-3}$ to $1E14\ cm^{-3}$. In case the semiconductor device 510 is based on SiC, a mean impurity concentration in the drift zone 121 may be between $5E14\ cm^{-3}$ and $1E17\ cm^{-3}$, for example in a range from $1E15\ cm^{-3}$ to $1E16\ cm^{-3}$.

The base region 120 may further include a field stop layer 128 of the first conductivity type between the drift zone 121 and the second surface 102. A mean net impurity concentration in the field stop layer 128 may exceed the mean net impurity concentration in the drift zone 121 by at least one order of magnitude. The base region 120 may include further doped zones, for example, zones forming a compensation structure, barrier zones for locally increasing a charge carrier plasma density and/or buffer layers.

An emitter layer 130 is sandwiched between the base region 120 and the second surface 102. The emitter layer 130 directly adjoins the second surface 102 and may directly adjoin the drift zone 121 or, if applicable, the field stop layer 128, by way of example.

In the illustrated embodiment referring to IGFETs and desaturable semiconductor diodes, the emitter layer 130 is a contiguous layer of the first conductivity type. A dopant concentration in the emitter layer 130 is sufficiently high to form an ohmic contact with a metal directly adjoining the second surface 102. In case the semiconductor body 100 is based on silicon (Si), a maximum dopant concentration for an n-type emitter layer 130 may be at least $1E18\ cm^{-3}$, for example at least $6E19\ cm^{-3}$.

From the first surface 101 control structures 160 extend into the drift zone 121. A distance between the first surface 101 and a bottom of the control structures 160 may range from 1 µm to 30 µm, e.g., from 3 µm to 7 µm. The control structures 160 include a conductive control electrode 165, which may include or consist of a heavily doped polycrystalline silicon layer, a metal-containing layer, or both. Some or all of the control electrodes 165 may be electrically coupled or connected to a control terminal CTR of the semiconductor device 510. According to other embodiments some of the control electrodes 165 may be electrically connected to a potential different to that of the control terminal CTR. A control dielectric 161 separates the respective control electrode 165 from the semiconductor body 100 and capacitively couples the control electrode 165 to adjoining portions of the semiconductor body 100.

The control structures 160 pattern a section of the drift zone 121 oriented to the first surface 101 such that the drift zone 121 includes a plurality of first drift zone sections 121a in semiconductor mesas 150 formed between the control structures 160 as well as a contiguous second drift zone section 121b in a portion of the semiconductor body 100 between a buried edge of the control structures 160 and the second surface 102. A dielectric structure 205 may electrically insulate the control electrodes 165 from conductive structures outside the semiconductor body 100.

The semiconductor mesas 150 between the control structures 160 are formed from portions of the semiconductor body 100. Horizontal cross-sectional areas of the semiconductor mesas 150 may be circles, ellipses, ovals or polygons with or without rounded corners, for example rectangles or squares and ring-like control structures 160 may surround the semiconductor mesas 150, respectively. According to other embodiments, horizontal cross-sectional areas of the semiconductor mesas 150 are stripes extending through an active area of the semiconductor body 100, wherein the semiconductor mesas 150 may be arranged at a regular pitch (center-to-center distance).

In the semiconductor mesas 150 body zones of a second conductivity type opposite to the first conductivity type are formed between the first surface 101 and the first drift zone sections 121a, respectively. The body zones 115 form first pn junctions pn1 with the first drift zone sections 121a. The body zones 115 are electrically connected or coupled to a first load terminal L1 of the semiconductor device 510. In addition, some of the control electrodes 160 may be electrically connected or coupled to the first load terminal L1. The electrode layer 130 is electrically connected to a second load terminal L2.

In a portion including the respective first drift zone section 121a some or all of the semiconductor mesas 150 include a constricted section 159 with a constriction length d1 along the vertical extension of the semiconductor mesa 150. A constriction width w1 given by the minimum horizontal width of the first drift zone section 121a parallel to the first surface 101 in the constricted section 159 is smaller than a corresponding maximum horizontal width of the body zone 115. According to an embodiment the constriction width w1 is smaller than a corresponding junction width w2 given by the horizontal width of the first pn junction pn1 in the same semiconductor mesa 150. A constriction length d1 within which the width of the constricted section 159 deviates from the constriction width w1 by not more than 20% may be at least 0.5 μm, for example at least 0.8 μm.

The respective constricted section 159 may be formed in a section of the semiconductor mesa 150 close to the contiguous second drift zone section 121b or in a central section of the first drift zone section 121a between the first pn junction pn1 and the second drift zone section 121b. The semiconductor mesas 150 may have approximately vertical sidewalls in upper sections oriented to the first surface 101 and including the body zones 115. The constricted section 159 is or includes a bottle neck or constriction in a portion of the semiconductor mesa 150 between the first pn junction pn1 and the contiguous second drift zone section 121b.

The junction width w2 may be between 100 nm and 3 μm, e.g., 150 nm and 1 μm and the constriction width w1 may be at most 80%, for example at most 50% of the junction width w2. According to an embodiment, the constriction width w1 is in the range from 20 nm to 300 nm. For example, the junction width w2 is about 200 nm and the constriction width w1 may be in a range from 100 nm to 160 nm.

The constriction drastically increases a difference of emitter efficiency between a first state with no inversion layer formed in the drift zone 121 along the control structures 160 and a second state with inversion layers formed along the control structures 160.

The semiconductor device 510 of FIG. 1B may be an RC-IGBT or a desaturable semiconductor diode.

The emitter layer 130 includes first zones 131 of the first conductivity type and second zones 132 of the second conductivity type. For desaturable semiconductor diodes the second zones 132 may improve the draining of holes during a reverse recovery mode. For RC-IGBTs the first zones 131 enable the reverse conducting functionality. The dopant concentrations in the first and second zones 131, 132 are sufficiently high to form ohmic contacts with a metal directly adjoining the second surface 102. In case the semiconductor body 100 is based on silicon (Si) a dopant concentration in the second zones 132 may be at least $5E16$ cm$^{-3}$, for example at least $1E18$ cm$^{-3}$. For further details, reference is made to the description of FIG. 1A.

Figure 2B:
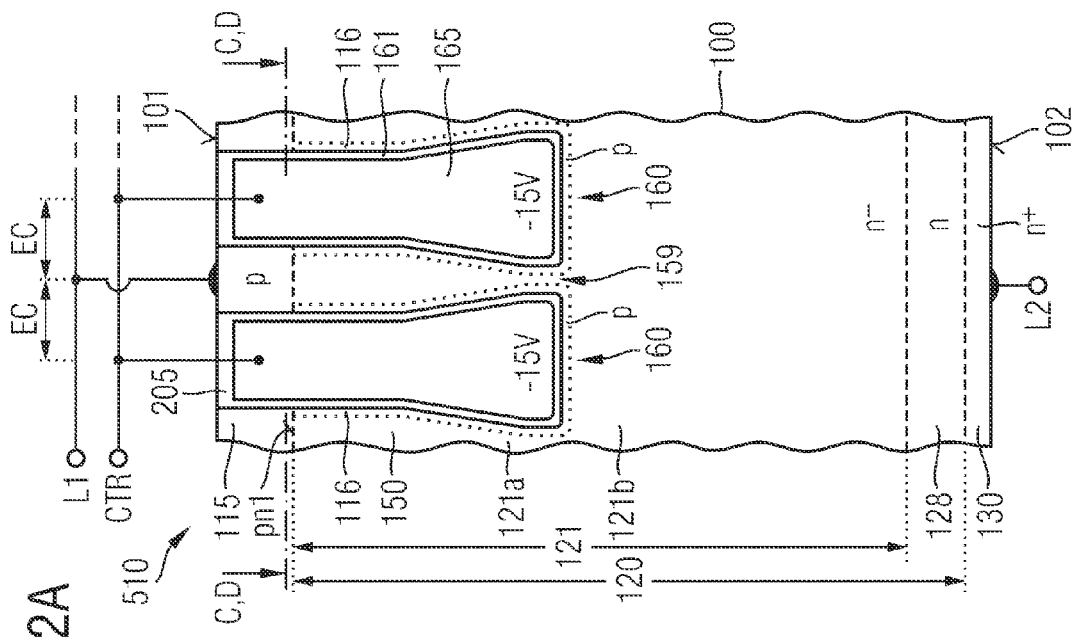
FIG. 2B is a schematic cross-sectional view of the semiconductor device portion of FIG. 2A at a control voltage of 0 V for illustrating effects of the embodiments.

FIGS. 2A to 2B illustrate a mode of operation of the semiconductor devices 510 of FIGS. 1A and 1B. For the following description the first conductivity type is n-type and the second conductivity type is p-type. Equivalent considerations apply for embodiments with the first conductivity type being p-type and the second conductivity type being n-type.

In a first aspect FIGS. 2A and 2B refer to a desaturable semiconductor diode with the first load terminal L1 effective as anode terminal electrically connected to the body zones 115 and the second load terminal L2 effective as cathode terminal electrically connected to the emitter layer 130.

FIG. 2A shows the semiconductor device 510 in a static or enhanced diode mode, during which a negative voltage of, for example −15 V, is applied to the control terminal CTR. P-type inversion layers 116 form in portions of the drift zone 121 that directly adjoin the control structures 160. The p-type inversion layers 116 directly adjoin the p-type body zone 115 and are effective as hole emitter injecting holes into the drift zone 121 thereby increasing the density of positive charge carriers in the drift zone 121. In addition, only a small area remains for electrons to pass through the constricted section 159 between the p-type inversion layers 116 and to travel towards the body zone 115. Both effects contribute to a denser charge carrier plasma in portions of the drift zone 121 at the base of the concerned semiconductor mesas 150. The denser charge carrier plasma decreases the forward resistance of the semiconductor diode.

A half of the semiconductor mesa 150 and the adjoining control structure 160 controlling the p-type inversion channel 116 in the respective mesa half form an enhancement cell EC, which is active in an enhancement or static diode mode.

FIG. 2B shows the semiconductor device 510 in a desaturation mode during which the control voltage is set to a voltage at which no inversion channels are formed in the drift zone 121, for example to 0 V. For mobile charge carriers the body zone 115 appears hidden behind the constricted section 159. The current density in the constricted section 159 of the semiconductor mesa 150 is higher than in a semiconductor mesa without constricted section 159. The increased current density reduces emitter efficiency such that in the desaturation mode the effective injection of holes into the drift zone 121 is significantly reduced not only with respect to the static or enhanced diode mode but also with respect to semiconductor mesas without constriction. As a consequence, deactivating the enhancement cells EC at 0V corresponds to a desaturation of the semiconductor device 510.

In another aspect, the semiconductor device 510 is an IGFET, wherein the first load terminal L1 is a source terminal and the second load terminal L2 is a collector terminal. In addition to the enhancement cells EC the IGFET includes transistor cells forming electron channels connecting the first load terminal L1 and the drift zone 121 for electrons in a forward conductive mode.

Gate electrodes for controlling the transistor cells may be separated from the control electrodes controlling the enhancement cells. According to other embodiments the gate electrodes of the transistor cells and the control electrodes of the enhancement cells may be electrically connected with each other and the control terminal CTR may be effective as a common gate terminal.

In a reverse mode with a negative voltage applied between the first and second load terminals L1, L2, the IGFET may be operated in a static or enhanced diode mode as illustrated in FIG. 2A. Before changing to the forward mode, the IGFET may be desaturated as illustrated in FIG. 2B. In the desaturation mode the IGFET retains its full blocking capability such that the IGFET can directly pass from the desaturation mode into a forward blocking mode.

According to another embodiment, the IGFET may be operated in a reverse conduction mode at a negative gate voltage of, e.g., −15 V and switches to a gate voltage of 0 V before the IGFET is forward-biased. The proposed structure would allow the realization of a low emitter efficiency.

In a further aspect the semiconductor device 510 is an RC-IGBT, wherein the emitter layer 130 includes both first zones of the first conductivity type and second zones of the second conductivity type. The first load electrode L1 corresponds to an emitter electrode and the second load electrode L2 to a collector electrode. As for IGFETs, additional transistor cells provide electron channels between the emitter electrode and the drift zone 121 in a forward conductive mode. The reverse conducting diode of the RC-IGBT may be operated in a high-efficient enhanced diode mode as illustrated in FIG. 2A and may be desaturated in a desaturation mode as depicted in FIG. 2B before the semiconductor device 510 changes to the forward biased mode. Since the IGBT retains its full blocking capability, the IGBT may directly pass from the desaturation mode into a forward blocking mode.

The enhancement cells EC may be uniformly distributed within an active area of the semiconductor device 510.

Figure 3A:
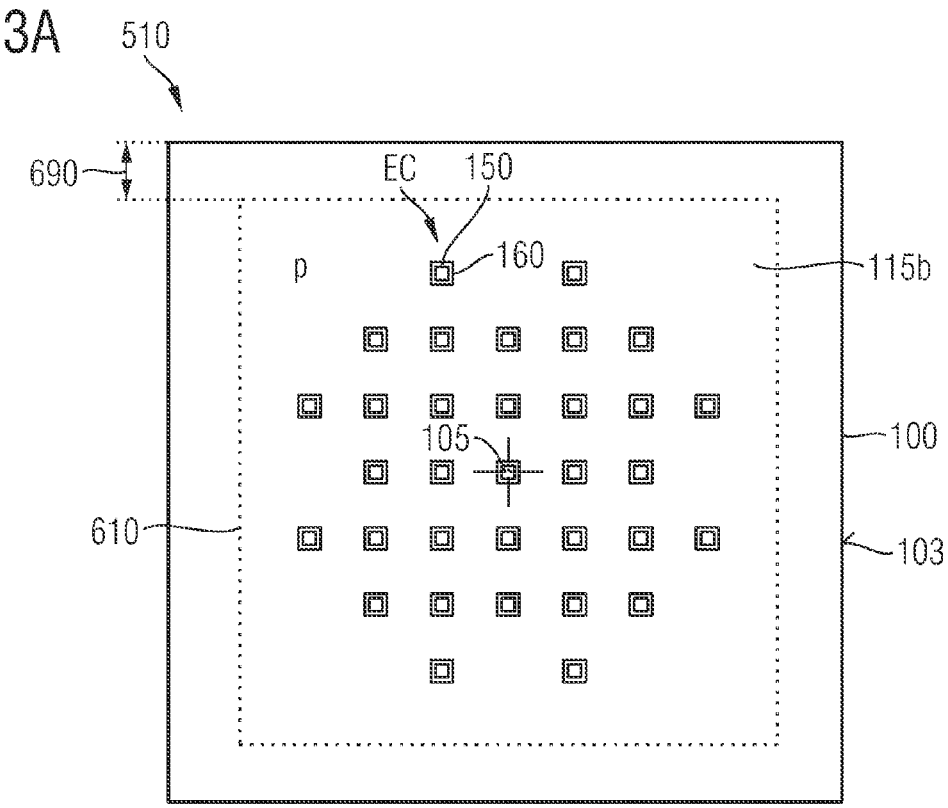
FIG. 3A is a schematic horizontal cross-sectional view of a semiconductor device for illustrating the distribution of local enhancement cells according to an embodiment.
Figure 3B:
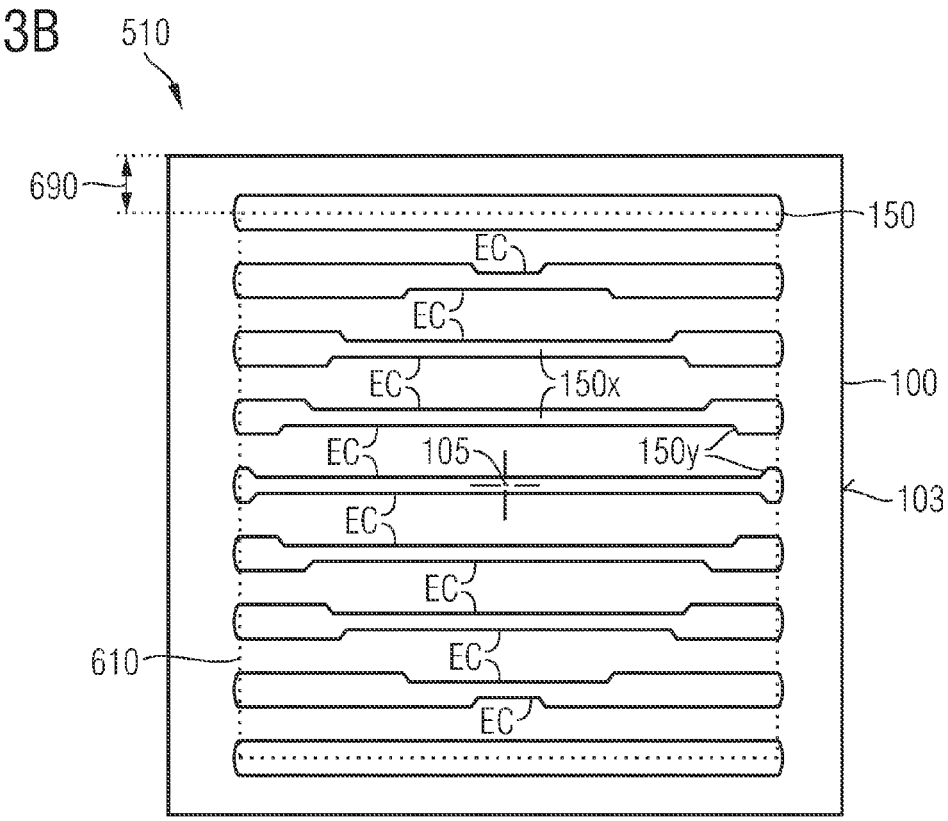
FIG. 3B is a schematic horizontal cross-sectional view of a semiconductor device for illustrating an arrangement of stripe-shaped enhancement cells according to a further embodiment.

FIGS. 3A and 3B refer to embodiments with an uneven distribution of the enhancement cells EC.

Figure 2C:
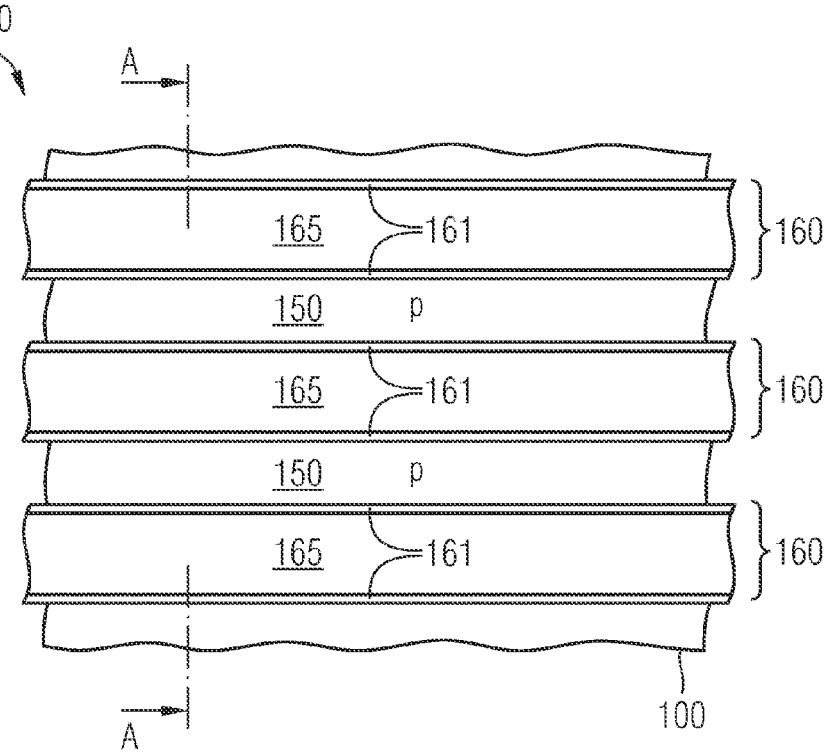
FIG. 2C is a horizontal cross-sectional view of the semiconductor device portion of FIG. 2A according to an embodiment related to control structures on two opposing sides of a semiconductor mesa.

FIG. 2C refers to an embodiment with the horizontal cross-sectional areas of the semiconductor mesas 150 as well as the control structures 160 being stripes, wherein a longitudinal extension of the stripes exceeds at least 10 times the respective width. The control structures 160 are arranged on two opposing long sides of an intermediate semiconductor mesa 150.

Figure 2D:
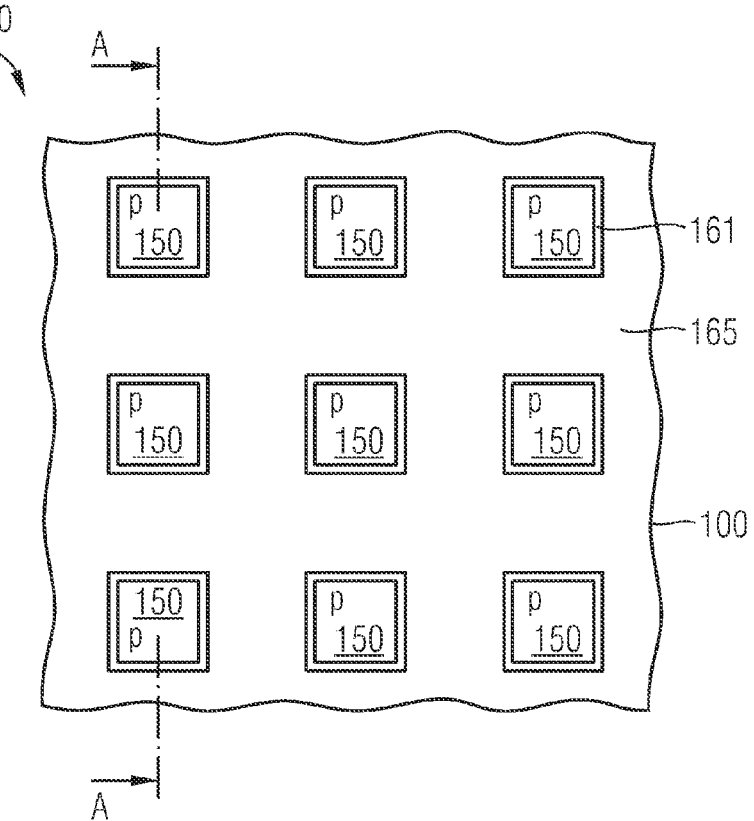
FIG. 2D is a schematic horizontal cross-sectional view of the semiconductor device portion of FIG. 2A according to an embodiment related to control structures on four sides of a semiconductor mesa.

FIG. 2D refers to an embodiment with the semiconductor mesas 150 formed in meshes of a grid formed by one or more control structures. According to the illustrated embodiment, the control structure 160 includes one single control electrode 165. According to other embodiments, the grid embedding the semiconductor mesas 150 may include two electrically separated control electrodes. The horizontal cross-sectional areas of the semiconductor mesas 150 may be polygons, e.g., rectangles such as squares with or without rounded corners, circles, or ovals, by way of example. The cross-sectional area of the semiconductor mesas 150 may be the same in the whole semiconductor body 100 or may vary.

The semiconductor device 510 of FIG. 2E refers to an embodiment with active semiconductor mesas 150a formed along first lines and passive semiconductor mesas 150b arranged along second lines, wherein one, two or more second lines with passive semiconductor mesas 150b may be arranged between neighboring first lines including the active semiconductor mesas 150a. First control structures 160a embed the active semiconductor mesas 150a of each first line and second control structures 160b embed the passive semiconductor mesas 150b in the second lines, respectively. Dielectric separation structures 167 insulate the first control structures 160a from the second control structures 160b. First control electrodes 165a of the first control structures 160a may be gate electrodes G and second control electrodes 165b of the second control structures 160b may be field electrodes F.

In FIG. 2F the semiconductor device 510 includes active semiconductor mesas 150a assigned to white fields and passive semiconductor mesas 150b assigned to black fields of a checkerboard pattern. The lines or rows may be shifted to each other by a distance less than a center-to-center distance of the semiconductor mesas 150a, 150b. First control structures 160a surround the active semiconductor mesas 150a on four horizontal sides and second control structures 160b surround passive semiconductor mesas 150b on all horizontal sides. An electrode separation structure 167 dielectrically insulates the first and second control structures 160a, 160b from each other. The horizontal cross-sectional areas of the active and passive semiconductor mesas 150a, 150b may be circles, ellipses or polygons, for example rectangles or squares with or without rounded corners.

Figure 2G:
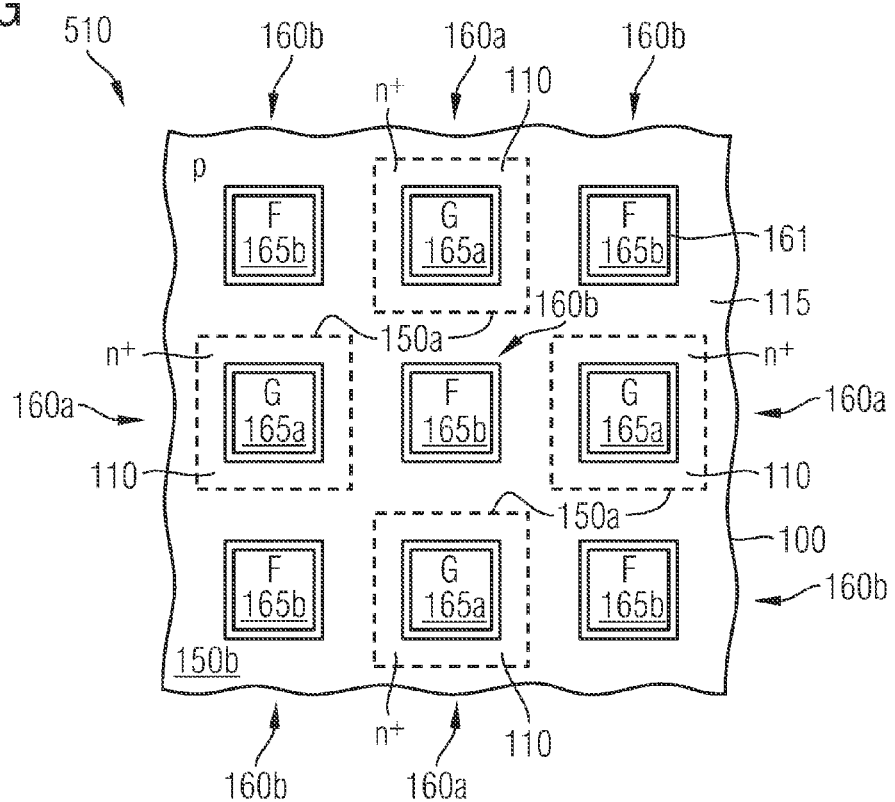
FIG. 2G is a schematic horizontal cross-sectional view of a semiconductor device according to an embodiment related to active and passive semiconductor mesas embedding first and second control structures arranged in a checkerboard pattern.

In the semiconductor device 510 of FIG. 2G the first and second control electrodes 165a, 165b are arranged in a checkerboard pattern with the first control electrodes 165a, which may be gate electrodes G, assigned to white fields and the second control electrodes 165b, which may be field electrodes F, assigned to black fields. The source zone 110 of an active mesa 150a surrounds the respective first control structures 160a with the gate electrodes G. The active and passive semiconductor mesas 150a, 150b form a grid with the first and second control structures 160a, 160b arranged in the meshes. The lines or rows of first and second control structures 160a, 160b may be shifted to each other by an interval which is smaller than the center-to-center distance between neighboring control structures 160a, 160b. The horizontal cross-sectional areas of the first and second control electrodes 165a, 165b may be circles, ellipses or polygons, for example rectangles or squares with or without rounded corners.

Figure 2H:
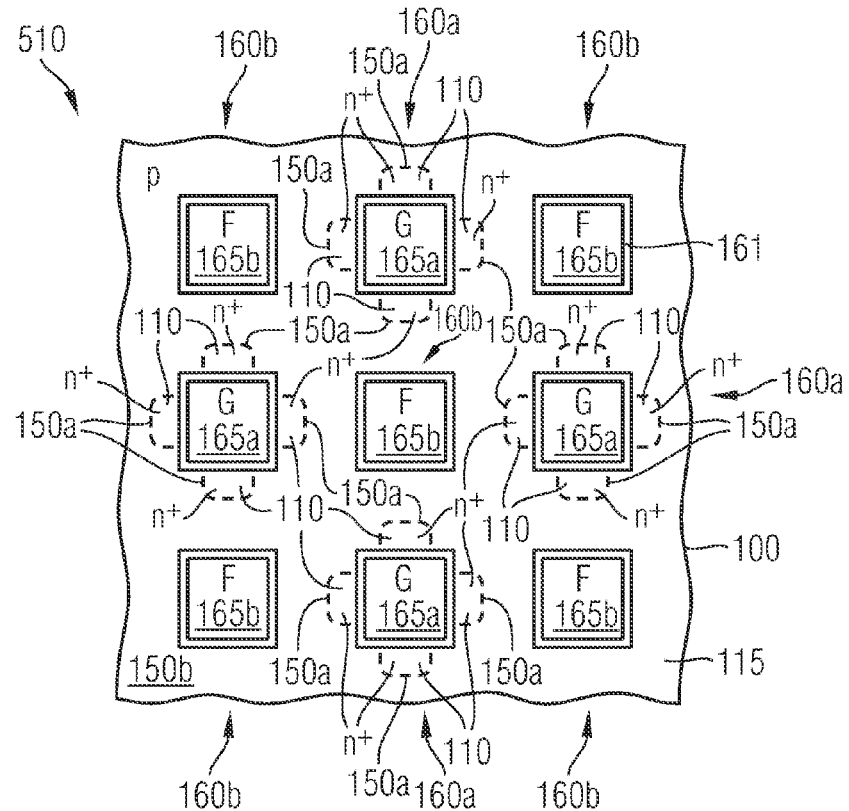
FIG. 2H is a schematic horizontal cross-sectional view of a semiconductor device according to an embodiment related to first and second control structures arranged in a checkerboard pattern and isolated source zones formed on four horizontal sides of the first control structures.

The embodiment of FIG. 2H differs from the one in FIG. 2G in that four isolated source zones 110 are assigned to each first control structure 160a. The four source zones 110 are arranged on opposing sides of the respective active control structure 160a.

FIG. 3A refers to enhancement cells EC including semiconductor mesas 150 surrounded by control structures 160, respectively. A semiconductor body 100 includes an active area 610 and an edge area 690 between the active area 610 and a lateral surface 103 of the semiconductor body 100. The lateral surface 103 connects the first and second surfaces 101, 102 on the front and rear side. The edge area 690 is devoid of any doped zone effective as anode region or body zone, surrounds the active area 610 and directly adjoins the lateral surface 103.

The enhancement cells EC may be arranged at nodes of a regular grid within the active area 610. Outside the enhancement cells EC a continuous anode zone 115b may be formed within the active area 690 of the semiconductor body 100. The enhancement cells EC may locally increase the emitter efficiency in an enhanced diode mode as described above.

A population density of the enhancement cells EC may decrease with increasing distance to a horizontal center 105 of the semiconductor body 100. Compared to embodiments with a uniform distribution of the enhancement cells EC, less charge carriers flood the edge area 690. A higher population density of enhancement cells EC in a central portion of the active area 610 than in an outer portion of the active area 610 adjoining the edge area 690 increases dynamic ruggedness in operation modes missing a desaturation pulse, e.g., at high switching frequencies and may result in a more uniform temperature distribution in the semiconductor device 500.

FIG. 3B refers to an embodiment with semiconductor mesas 150 with approximately stripe-shaped horizontal cross-sectional areas. Emitter efficiency is enhanced in first mesa portions 150x, where the semiconductor mesas 150 have constrictions, compared to the emitter efficiency in second mesa portions 150y with no or less pronounced constrictions. The cross-sectional plane cuts through the constrictions.

The first mesa portions 150x form enhancement cells EC with higher emitter efficiency than in the second mesa portions 150y. The population density of enhancement cells EC may decrease with increasing distance to a horizontal center 105 of the semiconductor body 100 to increase dynamic ruggedness. According to another embodiment, a population density of the enhancement cells EC may increase with increasing distance to the horizontal center to increase uniformity of a temperature distribution.

Figure 4A:
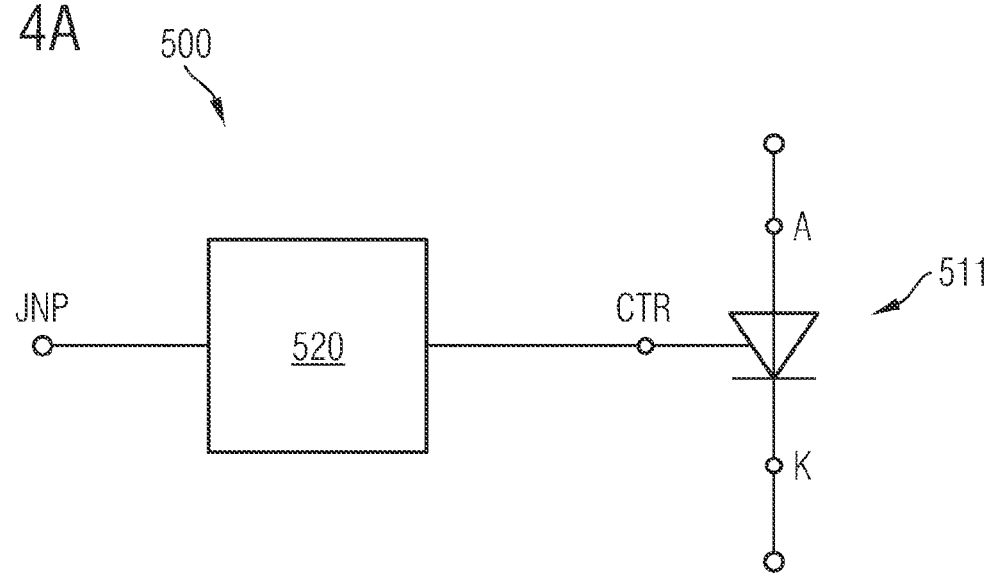
FIG. 4A is a schematic circuit diagram of an electronic circuit including a desaturable semiconductor diode according to FIG. 1A.
Figure 4B:
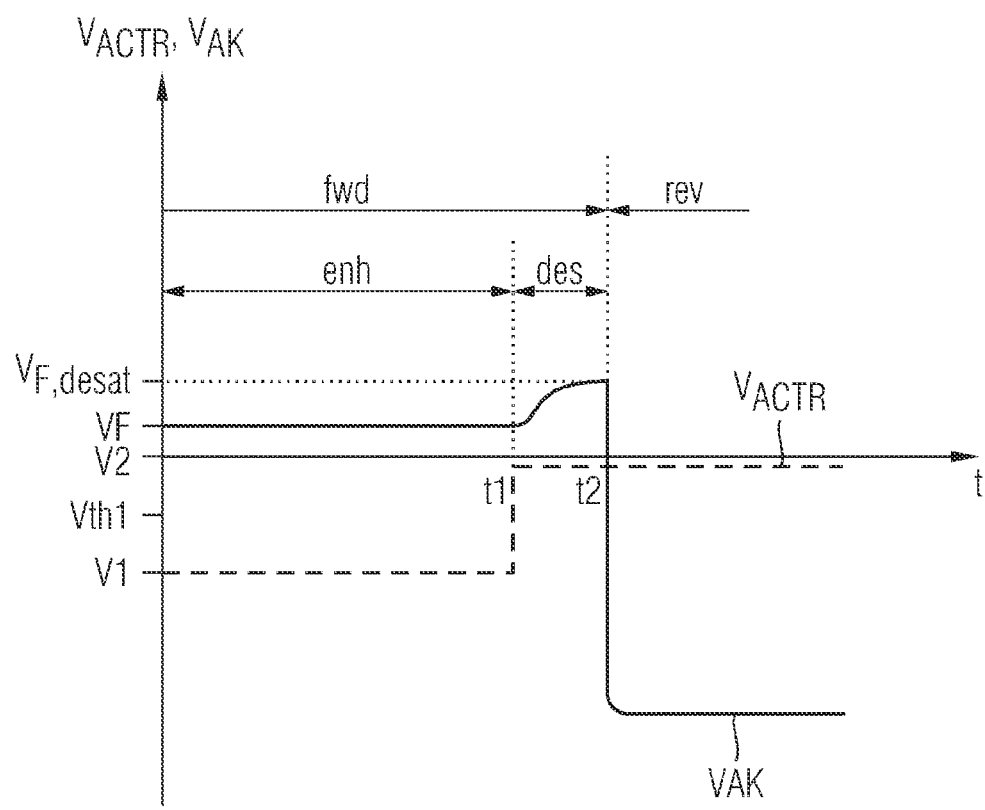
FIG. 4B is a schematic timing diagram illustrating a method of operating the electronic circuit of FIG. 4A.

FIGS. 4A and 4B refer to the use of a semiconductor diode 511 based on the semiconductor devices 510 of FIGS. 1A and 1B in an electronic circuit 500.

An output of a control circuit 520 is electrically coupled or connected to a control terminal CTR of the semiconductor diode 511, wherein the control terminal CTR is electrically connected or coupled to a control electrode formed in a control structure of the semiconductor diode 511. At an input terminal INP the control circuit 520 may receive a signal indicating a forthcoming change of the polarity of a voltage VAK applied between the anode and cathode terminals A, K of the semiconductor diode 511.

In a forward biased mode of the semiconductor diode 511 with a positive voltage VAK between the anode and cathode terminals A, K, the control circuit 520 may output a control signal VCTR with a signal level V1 beyond a first threshold voltage Vth1 at which inversion layers are formed in the drift zone. When the inversion layers in the drift zone are formed, the semiconductor diode 511 is operated at high emitter efficiency in an enhanced or static diode mode and due to the dense charge carrier plasma only a low forward voltage VF drops between the anode and cathode terminals A, K.

When the input signal of the control circuit 520 indicates a forthcoming polarity change of the voltage VAK across the semiconductor diode 511, the control circuit 520 may output a control signal VCTR with a signal level V2 below the first threshold voltage Vth1 at t1. The enhancement cells EC are deactivated. Deactivating the enhancement cells EC lowers emitter efficiency and is equivalent to a desaturation mode during which the charge carrier plasma density decreases and the forward voltage VAK steadily increases to a higher value VF,desat.

At t2 the polarity of the voltage VAK across the anode and cathode terminals A, K changes. Since the semiconductor diode 511 retains its full blocking capability during the desaturation mode, the semiconductor diode 511 can directly pass from the desaturation mode into a reverse blocking mode. Since the desaturation mode reduces the charge carrier plasma, the reverse recovery charge is reduced and less charge must be drained off during the recovery process than without desaturation. Dynamic switching losses are reduced.

Figure 5B:
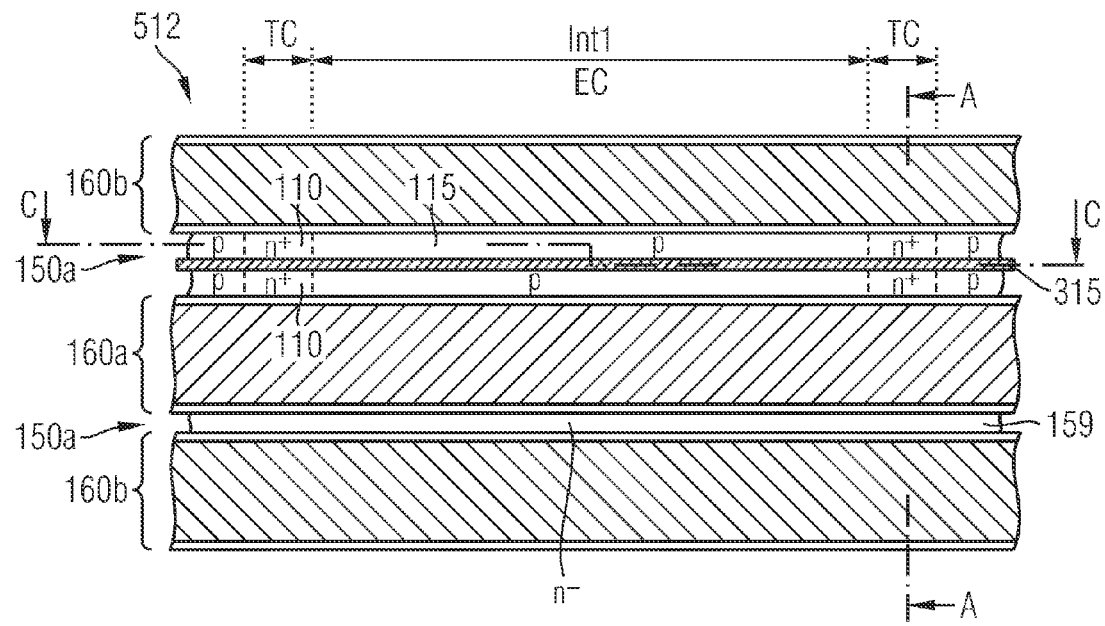
FIG. 5B is a schematic horizontal cross-sectional view of the semiconductor device portion of FIG. 5A along line B-B.
Figure 5C:
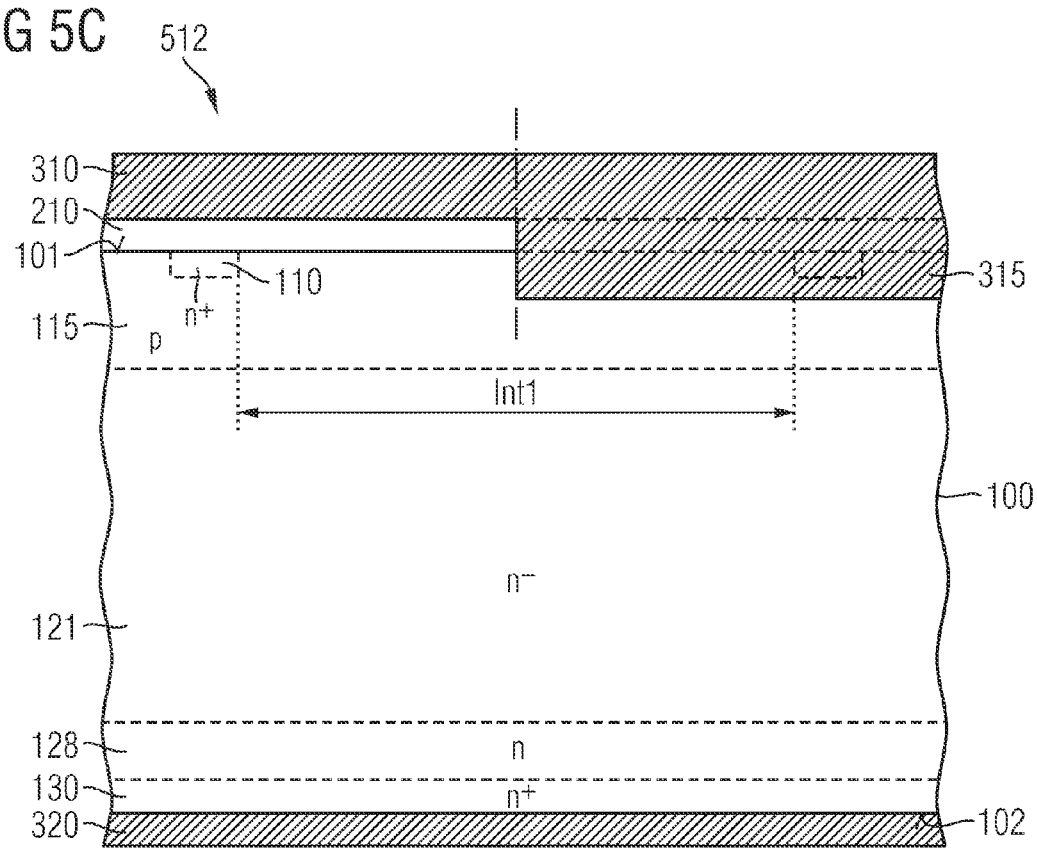
FIG. 5C is a schematic vertical cross-sectional view of the semiconductor device portion of FIG. 5A along line C-C.

FIGS. 5A to 5C refer to an RC-IGBT 512 based on the semiconductor device 510 of FIG. 1B. As regards details of the base region 120 and the emitter layer 130 reference is made to the description of the previous Figures. At least some of the semiconductor mesas 150 are active semiconductor mesas 150a including source zones 110 of the first conductivity type, wherein the body zones 115 of the respective active semiconductor mesa 150a separate the source zones 110 from the drift zone 121.

Control electrodes 165 of first control structures 160a are electrically connected to a gate terminal G. In addition to the first control structures 160a, the RC-IGBT 512 may include second control structures 160b whose control electrodes 165 may be electrically separated from the gate terminal G. According to the illustrated embodiment, the control electrodes 165 of the second control structures 160b are field electrodes F that may be electrically connected or electrically coupled to an emitter terminal E.

At least one of the control structures directly adjoining an active semiconductor mesa 150a is a first control structure 160a. The other control structure directly adjoining the concerned active semiconductor mesa 150a may be a further first control structure 160a or a second control structure 160b. A half of an active semiconductor mesa 150a and the adjoining half of a first control structure 160a form a transistor cell TC. Contact structures 315 extending through openings of a dielectric layer 210 electrically connect a first electrode 310 with the source zones 110 and with some or all of the body zones 115 of passive semiconductor mesas 150b without source zones 110.

The first dielectric structure 210 may dielectrically insulate the first electrode 310 from the control electrodes 165. The first electrode 310 may be electrically connected or coupled to the emitter terminal E. A second electrode 320 that directly adjoins the emitter layer 130 may form a collector terminal C or may be electrically coupled or connected to a collector terminal C.

Each of the first and second electrodes 310, 320 may consist of or contain, as main constituent(s) aluminum (Al), copper (Cu) or alloys of aluminum or copper, for example AlSi, AlCu or AlSiCu. According to other embodiments, the second electrode 320 may contain one, two, three or more sub-layers, wherein each sub-layer contains as a main constituent at least one of nickel (Ni), titanium (Ti), vanadium (V), silver (Ag), gold (Au), tungsten (W), platinum (Pt) and palladium (Pd). For example, sub-layers of the second electrode 320 may contain a metal nitride or a metal alloy containing Ni, Ti, V, Ag, Au, W, Pt, and/or Pd.

The dielectric structure 210 may include one, two or more sub-layers including thermally grown semiconductor dielectric, e.g. silicon oxide, deposited semiconductor oxide, e.g. deposited silicon(di)oxide using, for example, TEOS (tetraethylorthosilane) as precursor material, a semiconductor nitride, e.g. silicon nitride, or a glass, e.g. BSG (boron silicate glass), PSG (phosphorus silicate glass) or BPSG (boron phosphorus silicate glass), by way of example.

One, two or more passive semiconductor mesas 150b without source zones 110 may be arranged between active semiconductor mesas 150a including source zones 110.

According to FIGS. 5B and 5C, a plurality of spatially separated source zones 110 may be formed along the same active semiconductor mesa 150a, respectively. A horizontal width of the active and passive semiconductor mesas 150a, 150b at the first pn junction pn1 may range from 0.05 µm to 10 µm, e.g., from 0.15 µm to 1 µm. A first interval Int1 between source zones 110 arranged along the longitudinal axis of the respective active semiconductor mesa 150a may be in a range from 1 µm to 200 µm, for example in a range from 3 µm to 20 µm.

Figure 6A:
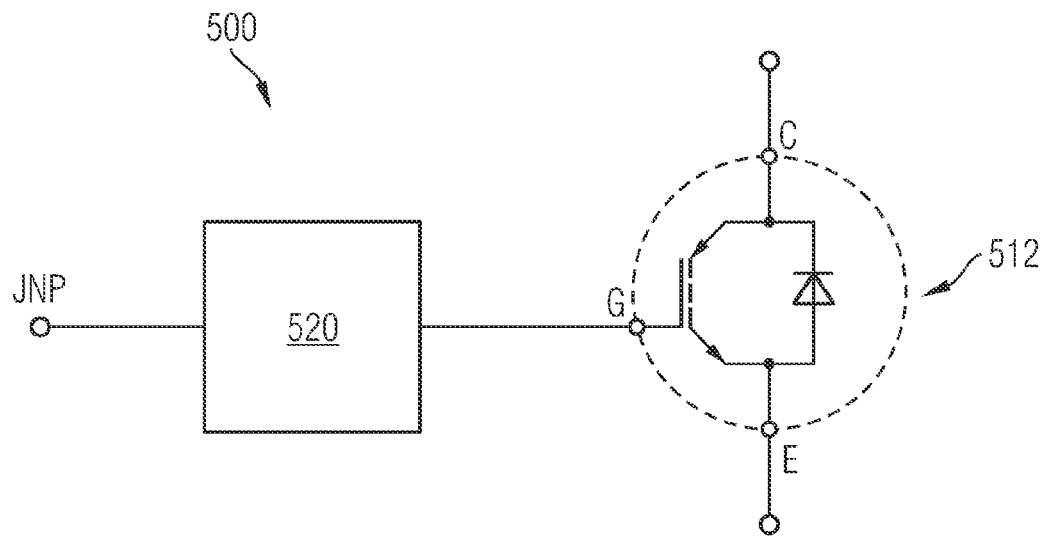
FIG. 6A is a schematic circuit diagram of an electronic circuit including an RC-IGBT according to the embodiment illustrated in FIG. 1B.
Figure 6B:
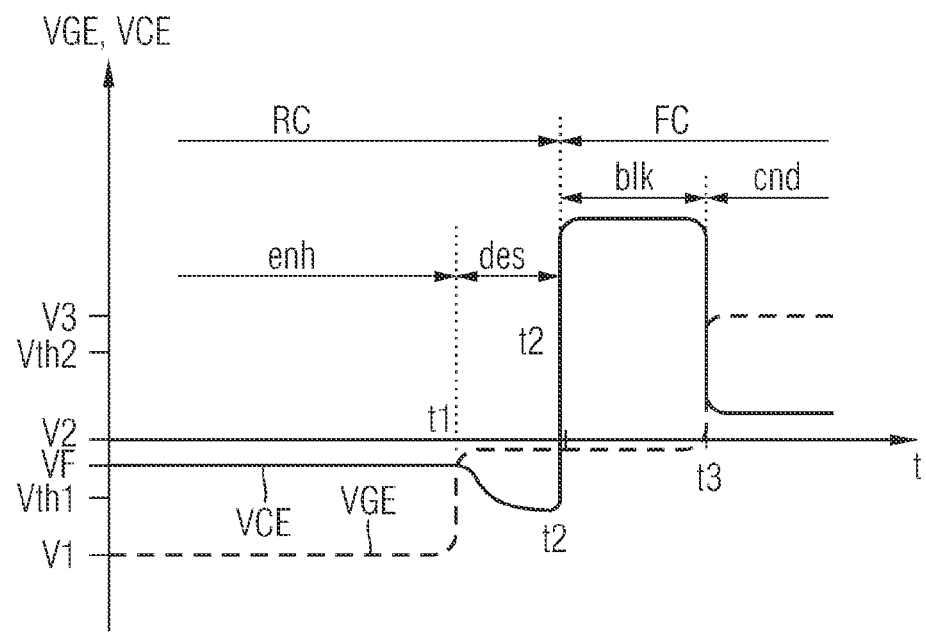
FIG. 6B is a schematic timing diagram for illustrating a method of operating the electronic circuit of FIG. 6A.

FIGS. 6A and 6B refer to an electronic circuit 500 including the RC-IGBT 512 of FIGS. 5A to 5C as well as a method of operation implemented by the electronic circuit 500.

An output of a control circuit 520 is electrically connected or coupled to a gate terminal G of the RC-IGBT 512. An input INP of the control circuit 520 may indicate a forthcoming polarity change of a collector-to-emitter voltage VCE applied between the collector C and emitter electrodes E of the RC-IGBT 512.

According to the timing diagram of FIG. 6B at a gate voltage VGE beyond a first threshold voltage Vth1 of the enhancement cells, for example at VGE=V1, e.g., −15 V, the RC-IGBT 512 is in an enhanced diode mode with high emitter efficiency of the integrated freewheeling diode, high charge carrier plasma density and low voltage drop VF over the reverse diode. After receiving a signal indicating a forthcoming polarity change of VCE, the control circuit 520 changes the gate voltage VG to a second voltage V2 below the first threshold voltage Vth1, e.g., 0V at t1. The emitter efficiency is reduced, the charge carrier plasma dissipates to some degree and the absolute value of VCE increases.

At t2 the polarity of VCE changes. Since the RC-IGBT 512 does not use a transistor channel for the desaturation mode, the RC-IGBT 512 retains its full blocking capability during the desaturation mode such that the polarity change may directly follow the desaturation mode. At t3 the control circuit 520 may change the gate voltage VG to beyond a second threshold voltage Vth2 at which inversion channels are formed through the body zones 115. The RC-IGBT 512 switches from the forward blocking mode to a forward conductive mode at a low VCE.

FIGS. 7A to 7E discuss effects of embodiments related to an n-channel RC-IGBT 512 with enhancement cells EC in, e.g., passive semiconductor mesas 150b, without source zones and formed between first control structures 160a whose control electrodes 165 are electrically connected to a gate terminal G. For further details, reference is made to the description of the RC-IGBT 512 of FIGS. 5A to 5C.

Figure 7D:
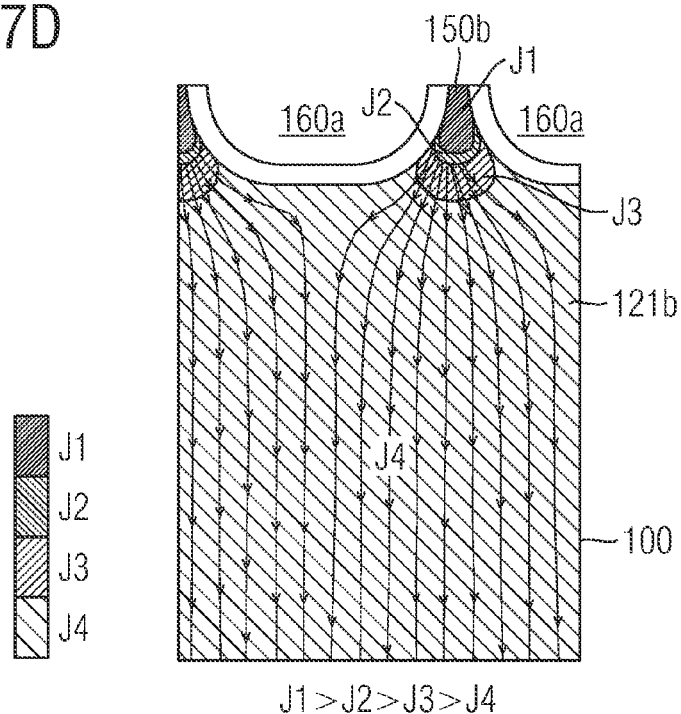
FIG. 7D is a schematic diagram showing the hole current density distribution along the base of the constricted semiconductor mesa in FIG. 7A at 0 V.

According to FIG. 7A the concerned n-channel RC-IGBT 512 includes active semiconductor mesas 150a with single-sided source zones 110 as well as passive semiconductor mesas 150b without source zones. A half of the active semiconductor mesa 150a containing the source zone 110 and the adjoining portion of a first control structure 160a forms a transistor cell TC. A passive semiconductor mesa 150b without source zones and between two first control structures 160a, whose control electrodes 165 are electrically connected or coupled to a gate terminal, and the two adjoining halves of the adjoining first control structures 160a form two enhancement cells EC. Reference sign 198 indicates a region of interest whose charge carrier distribution is illustrated for different gate voltages in FIGS. 7B to 7E.

FIG. 7B shows the hole current density at VG=−15V. The increased hole current density along the first control structures 160a indicates thin p-type inversion layers 116 induced by the gate voltage along the first control structures 160a. The p-type inversion layers 116 are in electric contact with the body zone 115 and act as strong hole emitter injecting holes at a comparable high hole current density into the drift zone 121.

The consequences are high hole emitter efficiency and a high charge carrier plasma density at a base portion of the concerned passive semiconductor mesa 150b in the reverse conducting mode, as can be seen by the electron concentration in FIG. 7C.

FIG. 7D shows the hole current density for VG=0V. The p-type body zone 115 is hidden behind the constricted section 159. Due to the small area of the effective anode emitter, hole current density is increased in the constricted section 159 compared to a structure without constriction. Since the emitter efficiency decreases with increasing current density, the effective injection of holes into the drift region 121 is significantly reduced.

Figure 7E:
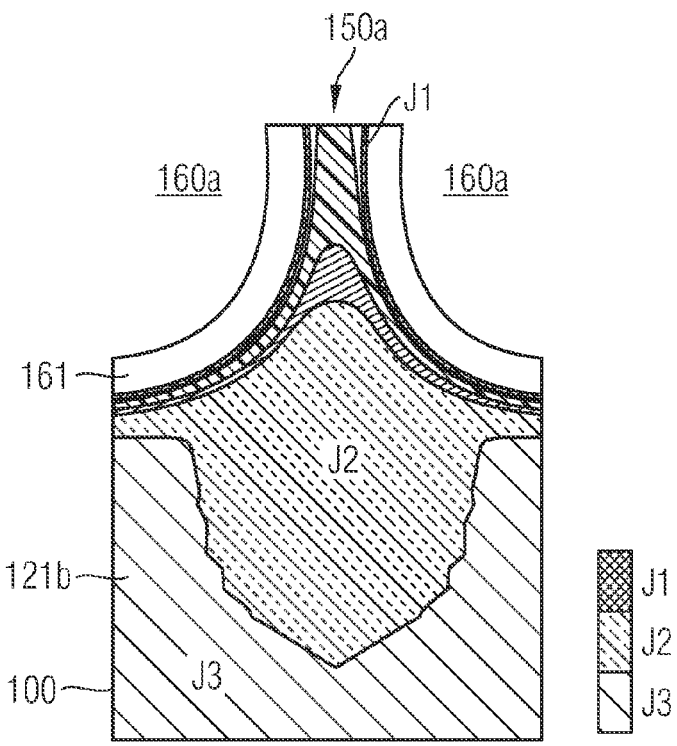
FIG. 7E is a schematic diagram showing the electron density distribution along the base of the constricted semiconductor mesa in FIG. 7A at 0 V.

In addition FIG. 7E, which shows the electron current density at VG=0, indicates that a wider path is open for electrons to pass the constricted section 159 such that the charge carrier plasma is further reduced. The constriction increases a spread of the charge carrier plasma density at −15V and 0V such that a desaturation mode using the difference between the charge carrier plasma densities is highly effective.

Figure 8A:
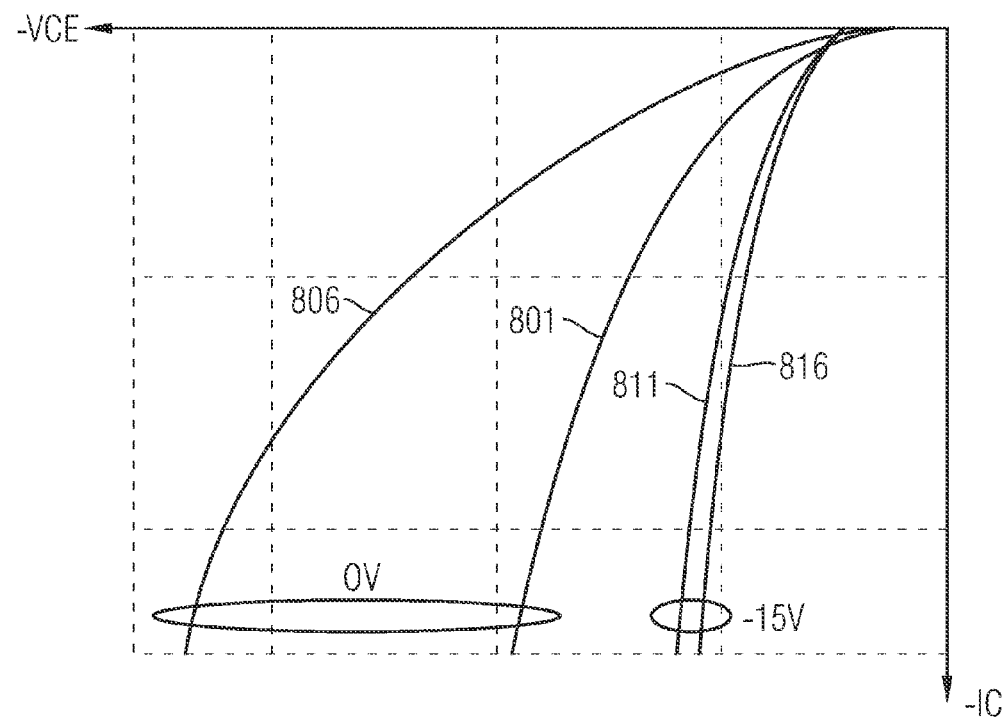
FIG. 8A shows the RC (reverse conducting) characteristics of the RC-IGBT of FIG. 7A at 0 V and −15 V at different constriction widths.
Figure 8B:
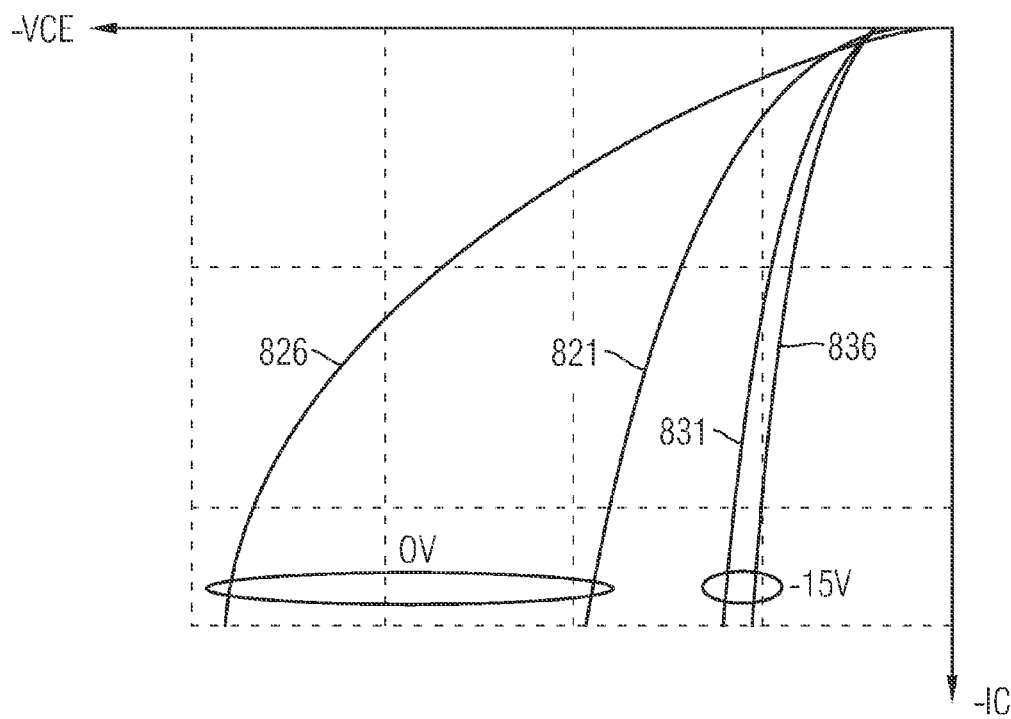
FIG. 8B shows the RC characteristics of the RC-IGBT of FIG. 7A at different lengths of the constricted semiconductor mesa sections at 0 v and −15 V.

FIGS. 8A to 8B illustrate the effective plasma injection efficiency as a function of the constriction width w1 and the constriction length d1.

FIG. 8A shows the RC characteristics of an RC-IGBT at different constriction widths w1 of the constricted sections 159 at equal constriction lengths and a pn junction width w2=200 nm. RC characteristics 801 and 811 refer to an embodiment with no constriction (w1=200 nm) and RC characteristics 806 and 816 refer to w1=120 nm. RC characteristics 801 and 806 refer to a gate voltage VGE=0V and RC characteristics 811 and 816 refer to VGE=−15V. The narrower the constriction, the denser is the charge carrier plasma at VGE=−15V and the sparser is the charge carrier plasma at VGE=0V. The difference between the enhanced diode mode and the desaturation mode increases with decreasing constriction width w1.

In FIG. 8B RC characteristics 821 and 831 refer to a constriction length d1=0.8 µm, and RC characteristics 826 and 836 refer to d1=1.8 µm, at equal constriction widths w1, respectively. The longer the constriction, the denser is the charge carrier plasma at VGE=−15V and the sparser is the charge carrier plasma at VGE=0V. The difference between the enhanced diode mode and the desaturation mode increases with increasing constriction length d1, wherein the constriction length d1 is equivalent to the length of the corresponding enhancement cell.

Figure 9A:
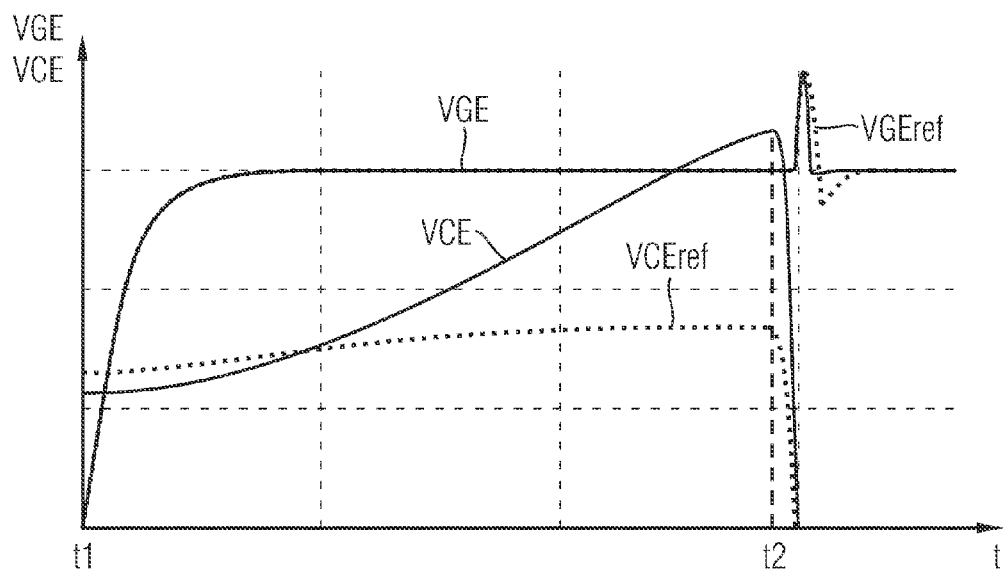
FIG. 9A is a schematic timing diagram for comparing gate voltage VG and emitter-to-collector voltages VCE of an RC-IGBT according to FIG. 7A with a reference example.
Figure 9B:
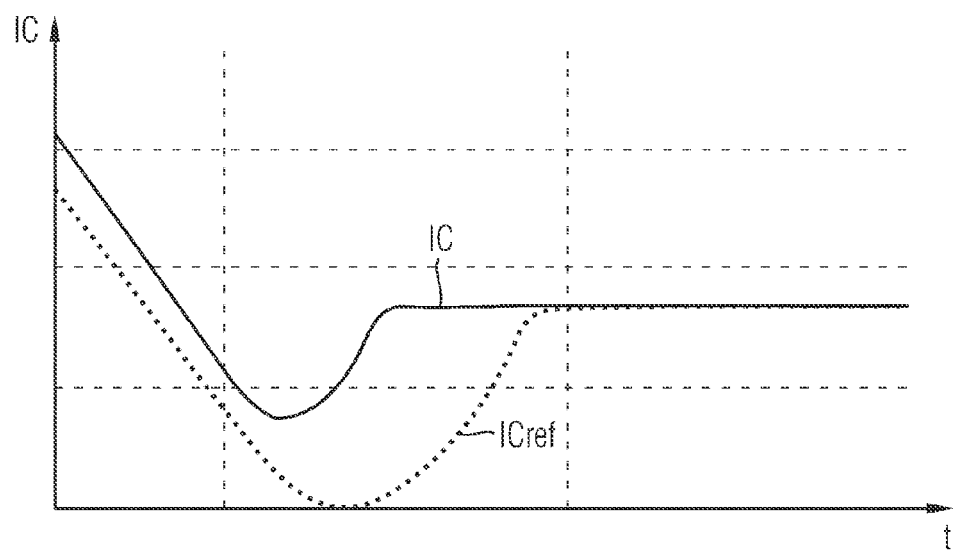
FIG. 9B is a schematic timing diagram for comparing collector current IC and gate voltage VG during reverse recovery of an RC-IGBT according to FIG. 7A with a reference example.

FIGS. 9A to 9B show the gate voltage VG, the collector-to-emitter voltage VCE and the reverse collector current IC during desaturation of the reverse diode in an RC-IGBT according to an embodiment compared to VGref, VCEref and ICref of a reference example with the same junction width w2 but without constriction.

As regards FIG. 9A the gate voltage VG is switched from −15 V to 0 V at t1. The total anode emitter efficiency is reduced and the charge carrier plasma becomes less dense. Hence VCE increases stronger than VCEref. At t2 a reverse recovery is initiated in the RC-IGBT, for example when the concerned RC-IGBT is used as a high side switch in a half bridge configuration in which the low side switch turns on.

FIG. 9B shows that a reverse-recovery induced collector current IC decays faster and has a lower integral value than ICref of the reference example. As a result, switching losses are significantly reduced.

Figure 10A:
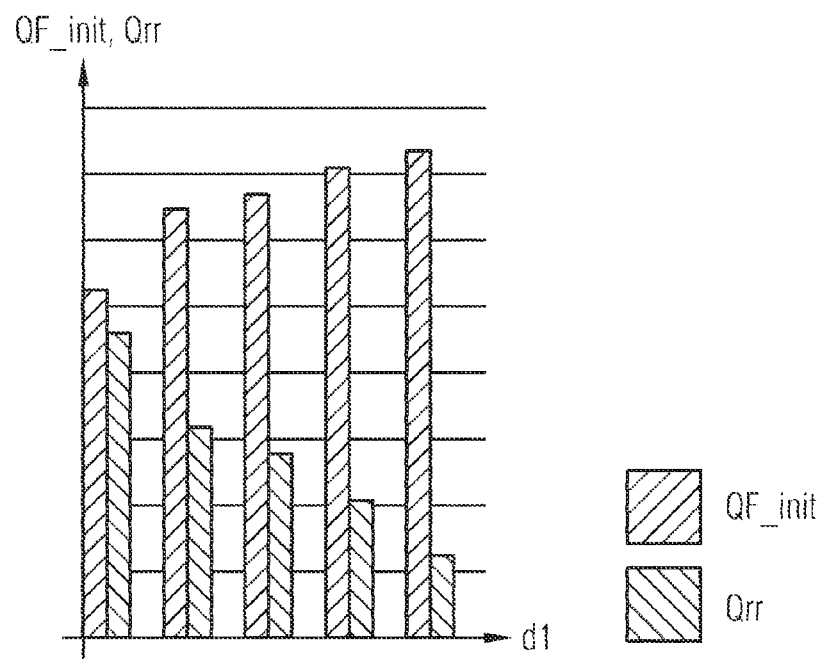
FIG. 10A is a schematic diagram illustrating the amount of charge during on-state and the reverse-recovery charge as a function of the length of the constricted semiconductor mesa section, respectively.
Figure 10B:
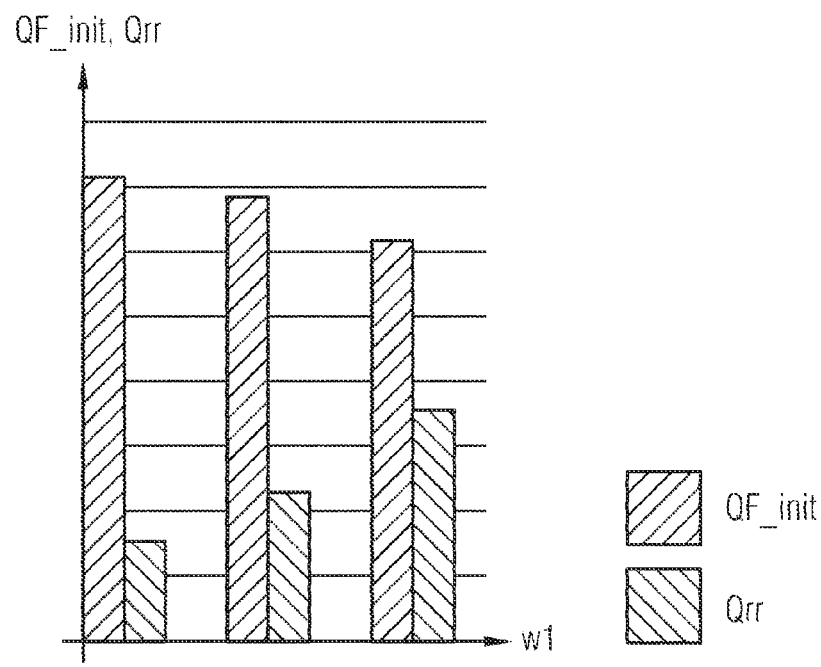
FIG. 10B is a schematic diagram illustrating the amount of charge during on-state and the reverse-recovery charge as a function of the constriction width of the constricted semiconductor mesa section, respectively.

FIGS. 10A and 10B illustrate a charge of QF_init, descriptive for the quasi-static stored charge carrier concentration in the drift zone during enhanced diode conduction at VGE=−15V, as well as the reverse recovery charge Qrr integrated over the collector current IC of FIG. 9B after desaturation at VGE=0V for different designs of the constricted section 159.

For a junction width w2 of 200 nm FIG. 10A shows that an increase of the constriction length d1 increases the difference between QF_init and Qrr. As a consequence, the efficiency of the constriction increases with increasing the constriction length d1 from about 200 nm to 2 µm.

FIG. 10B shows the effect of a variation of the constriction width w1 at constant constriction length d1. The efficiency of the constriction increases with decreasing constriction width w1. The constriction improves the trade-off between a high plasma density in enhanced diode mode and the reverse-recovery charge Qrr by enhancing the effective anode emitter area.

FIGS. 11A to 11E refer to embodiments which may be cumulatively combined with each other and with each of the embodiments of the previous FIGS.

The semiconductor device 510 of FIG. 11A differs from the ones in FIGS. 1A and 1B in that the base region 120 includes counter-doped islands 124 in the vertical projection of the control structures 160. The counter-doped islands 124 further increase the anode emitter efficiency in the enhancement mode and contribute to a further spread of the anode emitter efficiency between the enhanced diode mode and the desaturation mode.

In FIG. 11B the control dielectrics 161 include reinforced portions 161a at a bottom of the respective control structures 160. The reinforced portions 161a have a greater thickness than portions of the control dielectric 161 outside the reinforced portions 161a in sidewall portions directly adjoining the semiconductor mesas 150. A capacitive coupling between the control electrodes 165 and the drift zone 121 and, as a consequence, the output capacitance are reduced.

Figure 11C:
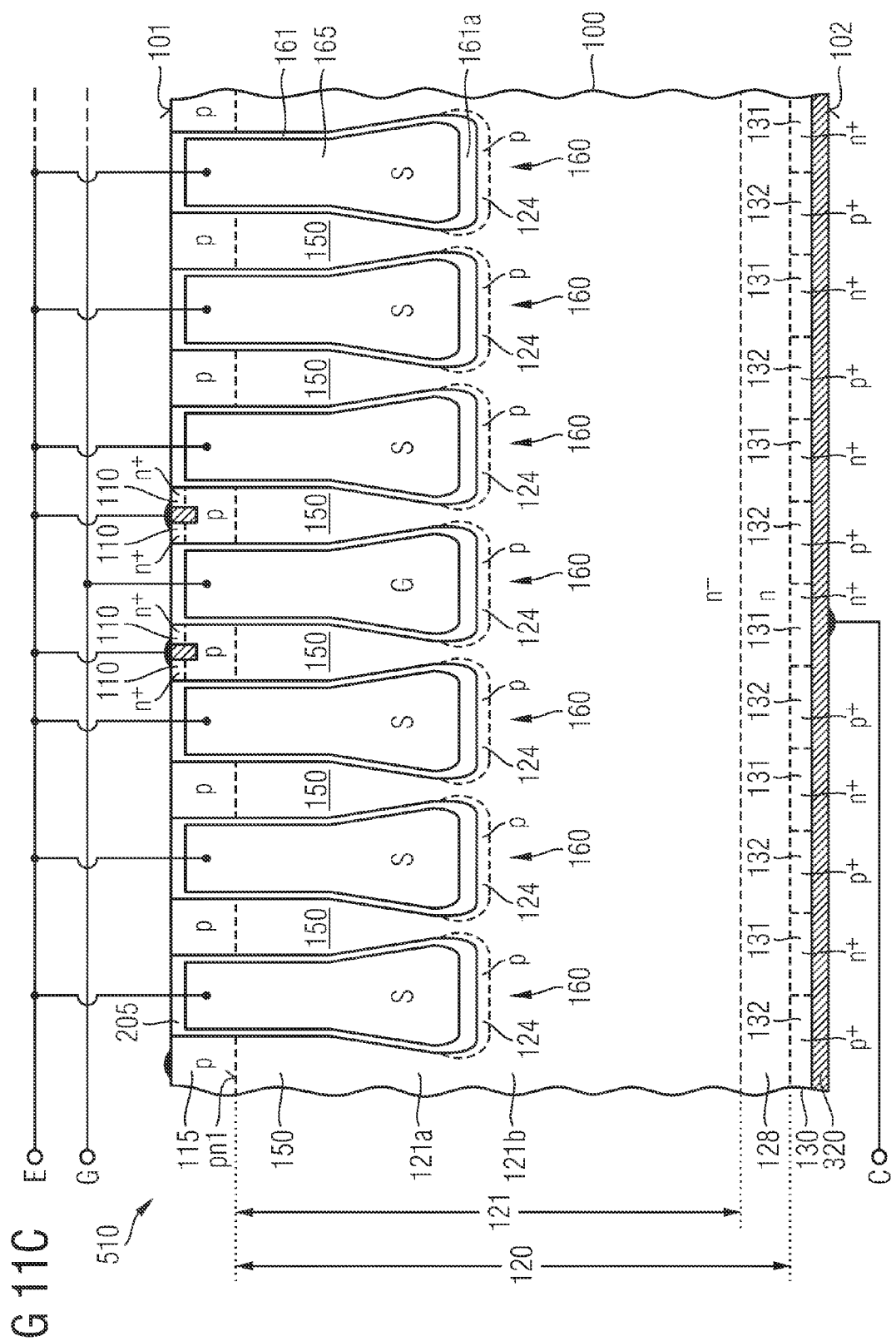
FIG. 11C is a schematic cross-sectional view of a portion of a semiconductor device in accordance with an embodiment combining enhanced capacitive decoupling and counter-doped islands with reference to an RC-IGBT.

In FIG. 11C the semiconductor device 510 is an RC-IGBT that combines the control dielectrics 161 with reinforced portions 161a at the bottom of the respective control structures 160 as illustrated in FIG. 11B with the counter-doped islands 124 in the vertical projection of the control structures 160 as illustrated in FIG. 11A. The counter-doped portions 124 at least partially compensate for the attenuated or missing p-type inversion layer in the drift zone 121 along the reinforced portions 161a in the enhanced diode mode.

Figure 11D:
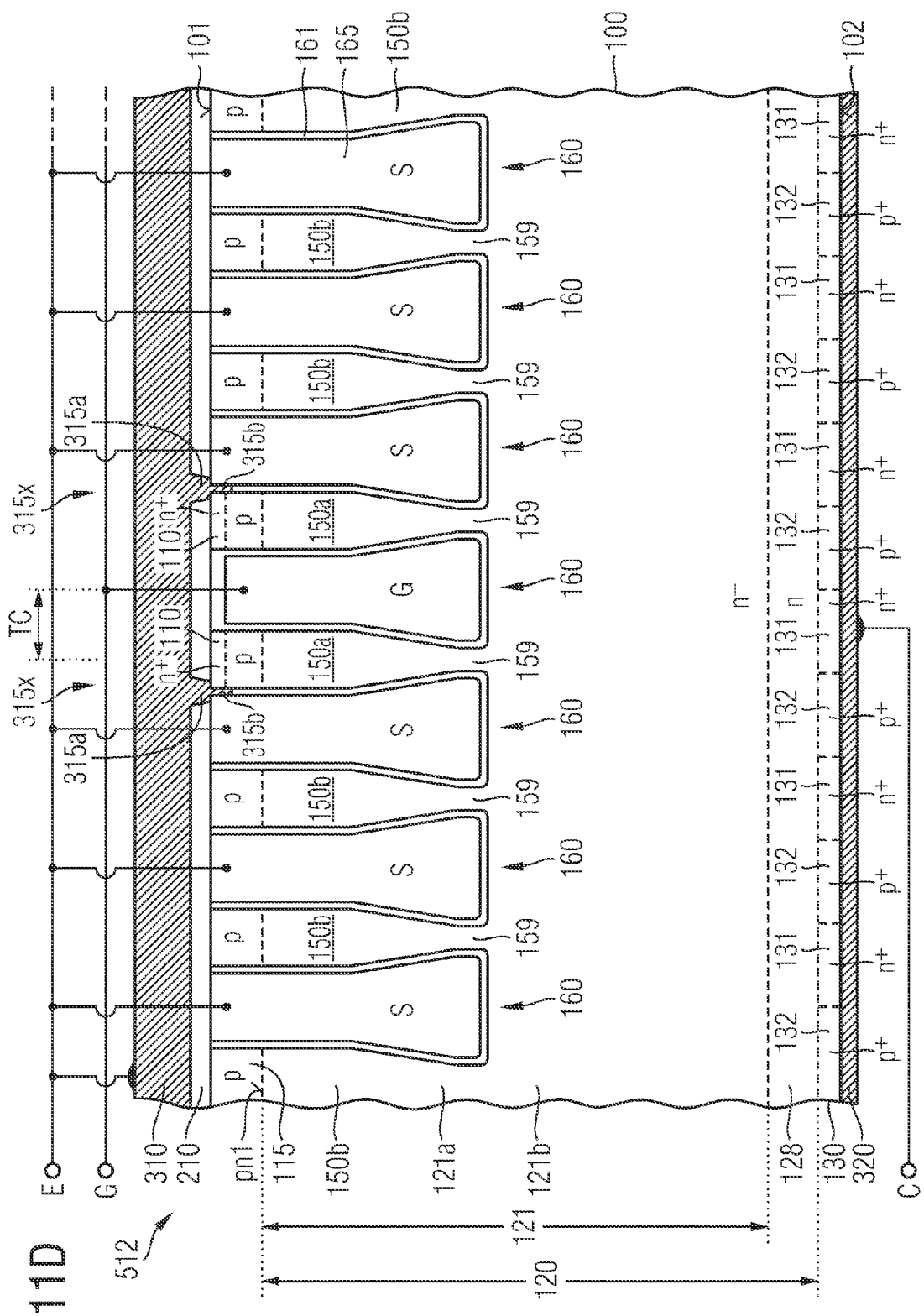
FIG. 11D is a schematic cross-sectional view of a portion of a semiconductor device concerning an RC-IGBT with combined mesa/field electrode contacts.

FIG. 11D refers to an RC-IGBT 512 which differs from the one illustrated in FIG. 5A by partially self-aligned contact structures 315x electrically connecting the first load electrode 310 with both the control electrodes 165 of second control structures 160b and active semiconductor mesas 150a including source zones 110. The partially self-aligned contact structures 315x include a first contact section 315a in an opening of the dielectric layer 210. The first contact section 315a overlaps both the concerned second control structure 160b and the adjoining active semiconductor mesa 150a. Placement and cross-sectional area of the first contact section 315a is defined by a photo mask in a lithographic patterning process. A second contact section 315b is arranged between the control electrode 165 of the concerned second control structure 160b and the concerned active semiconductor mesa 150a. A vertical extension of the second contact section 315b may be greater than a vertical extension of the source zones 110 such that the second contact section 315b directly adjoins both the source zone 110 and the body zone 115 in the same active semiconductor mesa 150a.

The second contact section 315b is formed by recessing, after opening the dielectric layer 210, an exposed portion of the control dielectric 161 and filling the resulting recess with a contact material. Once exposed by the opening in the first dielectric layer 210, the second contact section 315b is formed self-aligned with respect to the concerned second control structure 160b and the active semiconductor mesa 150a. The sidewalls of the second contact section 315b may be vertical. According to other embodiments at least one of the sidewalls may be tilted to the normal at an angle between 0 and 90 degree such that the second contact section 315b tapers with increasing distance to the first surface 101. Where typically uncertainties and inequalities of different lithographic layers may result in a misalignment between the contact structures 315 and the active semiconductor mesas 150a and therefore limit a minimal mesa width at about 600 nm, for DUV (deep ultraviolet) lithography the partially self-aligned contact structures 315x facilitate narrowing the width of the active semiconductor mesas 150a at the first surface 101 to less than 300 nm, for example to less than 200 nm, at least for active semiconductor mesas 150 including source zones 110 and adjoining first control structures 160a electrically connected to a gate terminal G.

Figure 11E:
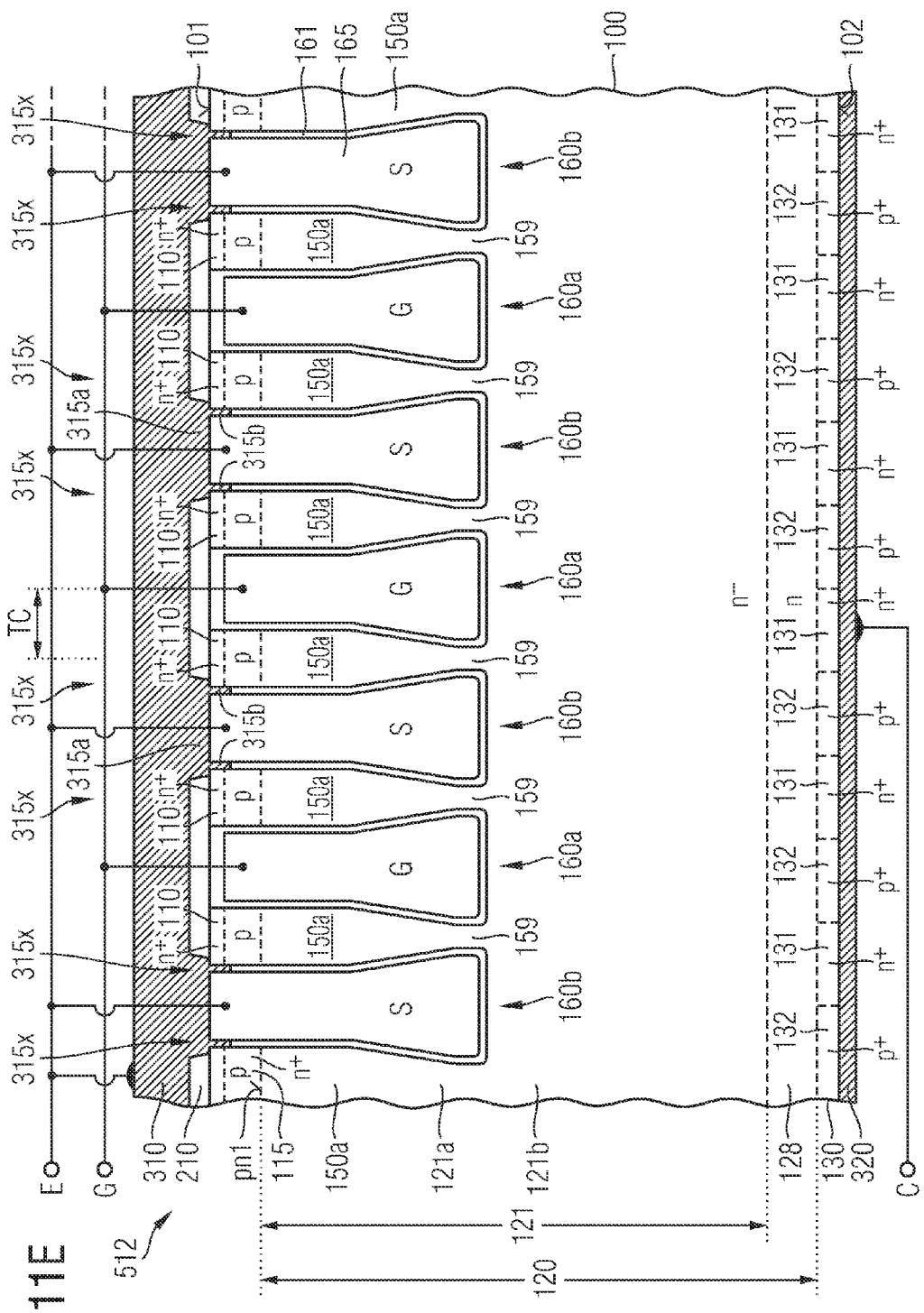
FIG. 11E is a schematic cross-sectional view of a portion of a semiconductor device concerning another RC-IGBT with combined mesa/field electrode contacts.

FIG. 11E refers to another embodiment concerning partially self-aligned contact structures 315x. First and second control structures 160a, 160b are alternately arranged and the partially self-aligned contact structures 315x may be formed on opposing sides of the concerned second control structures 160b, respectively. The first contact sections 315a of self-aligned contact structures 315x assigned to the same second control structure 160b may be separated from each other or may be combined in one single opening in the dielectric layer 210.

Figure 12B:
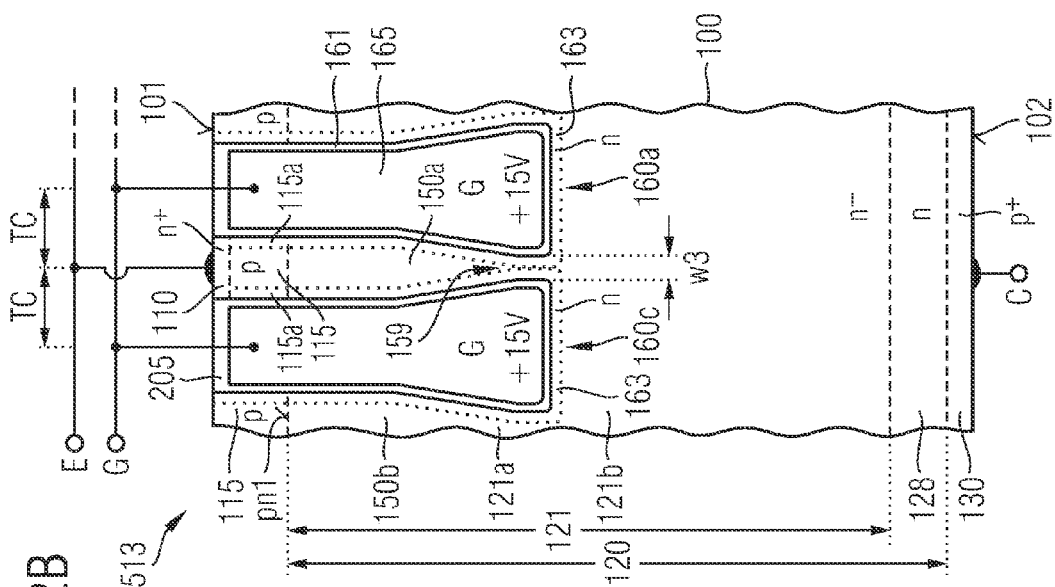
FIG. 12B is a schematic cross-sectional view of a portion of an IGBT with two gate structures at opposing sides of an active semiconductor mesa at a gate voltage of 15 V for illustrating effects of the embodiment.
Figure 12C:
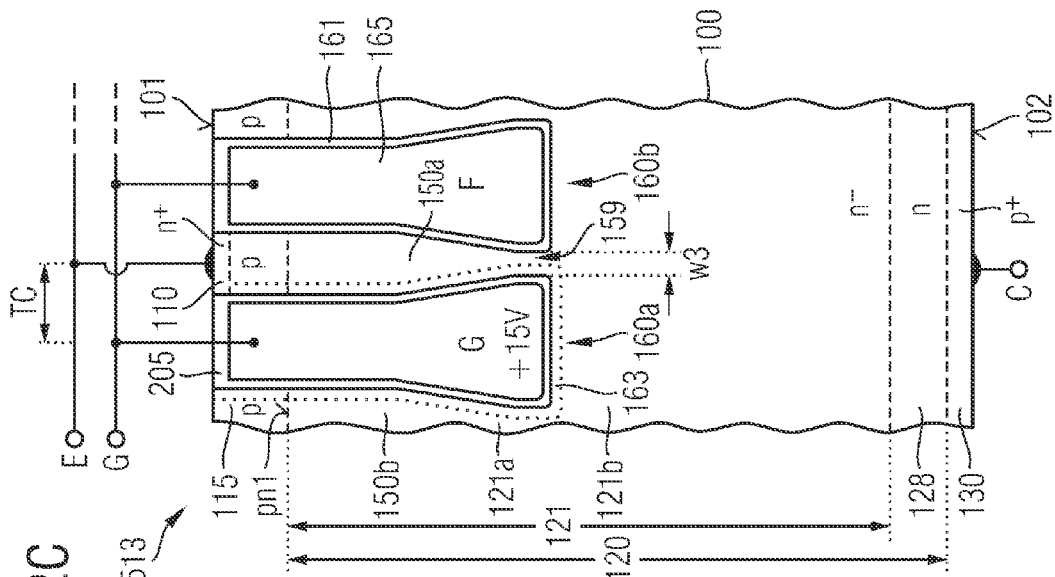
FIG. 12C is a schematic cross-sectional view of a portion of an IGBT with one single gate structure at one side of an active semiconductor mesa and a field structure at the opposing side at a gate voltage of 15 V for illustrating effects of the embodiment.

FIGS. 12A to 12C refer to a non-reverse conducting or reverse blocking IGBT 513 with a contiguous emitter layer 130 of the second conductivity type. As regards further details, reference is made to the description of the RC-IGBT 512 in FIGS. 5A to 5C.

FIG. 12A shows a constricted section 159 with a minimum width w3 equal to or smaller than the total width of accumulation layers formed in the first drift zone section 121a in the forward conductive mode along the active control structures 160a in the constricted section 159.

FIG. 12B refers to an active semiconductor mesa 150a between two first control structures 160a whose control electrodes 165 are electrically connected to a gate terminal G at a gate voltage VG=+15V. The gate voltage induces n-type inversion layers 115a in the body zone 115 and n-type accumulation layers 163 in the drift zone 121 along the first control structures 160a, respectively. The two neighboring n-type accumulation layers 163 adjoin to each other or overlap each other in the constricted section 159. As a result, no or only few holes pass through the constricted section 159 and can be drained off to the emitter terminal E through the body zone 115. The charge carrier plasma density is retained at a high level in the second drift zone section 121b in the conductive mode of the transistor cells TC. The same transistor cells TC remain active when the IGBT 513 is switched off at a gate voltage VG of 0 V or −15 V. Hence an inverse correlation between the VCE saturation voltage and the maximum field strength in the off-state may be relaxed.

FIG. 12C refers to an embodiment with the active semiconductor mesa 150a formed between a first control structure 160a and a second control structure 160b, which is effective as field effect structure. The minimum width w3 is given by the width of one single accumulation layer 163.

The IGBT 513 of FIG. 12D differs from the one in FIG. 12B in that first control structures 160a whose control electrodes 165 are electrically connected or coupled to a gate terminal G and effective as gate electrodes for the IGFET cells alternate with third control structures 160c that include at least field electrodes 165c electrically connected to a first load electrode that may be electrically connected to an emitter terminal E. In the illustrated embodiment, in a bottom portion oriented to the second drift zone portion 121b the third control structures 160c further include a control electrode 165 electrically connected or coupled to the gate terminal G to reduce the amount of holes that can be drained off to the emitter terminal E through the constricted section 159. A partially self-aligned contact structure 315x as described above directly adjoins the field electrode 165c, the source zone 110 and the body zone 115 in the illustrated section.

The formation of the constrictions of the semiconductor mesas 150a, 150b may include an isotropic etch effective from trenches in which the control structures 160, 160c are formed. Absolute tolerances of the isotropic etch increase with increasing etch duration and are proportional to a difference between the mesa width outside the constricted section 159, e.g. the junction width w2, and the constriction width w1.

Typically, alignment requirements for contacts to the field electrodes 165c and active semiconductor mesas 150a set a lower limit for the width of the active semiconductor mesas 150a at the first surface 101. By contrast, the alignment requirements for the partially self-aligned contact structure 315x are more relaxed and allow for reducing the width of the active semiconductor mesas 150a at the first surface. The self-aligned contact structure 315x therefore reduces the required difference between the mesa width outside the constricted section 159, e.g. the junction width w2, and the constriction width w1, and allows a significant reduction of the constriction width w1 compared to conventional approaches at given maximum tolerances.

The RC-IGBT 513 of FIG. 12E differs from the one in FIG. 12D in that control structures 160 including the field electrodes 165c do not contain control electrodes electrically connected or coupled to the gate terminal G.

Figure 13A:
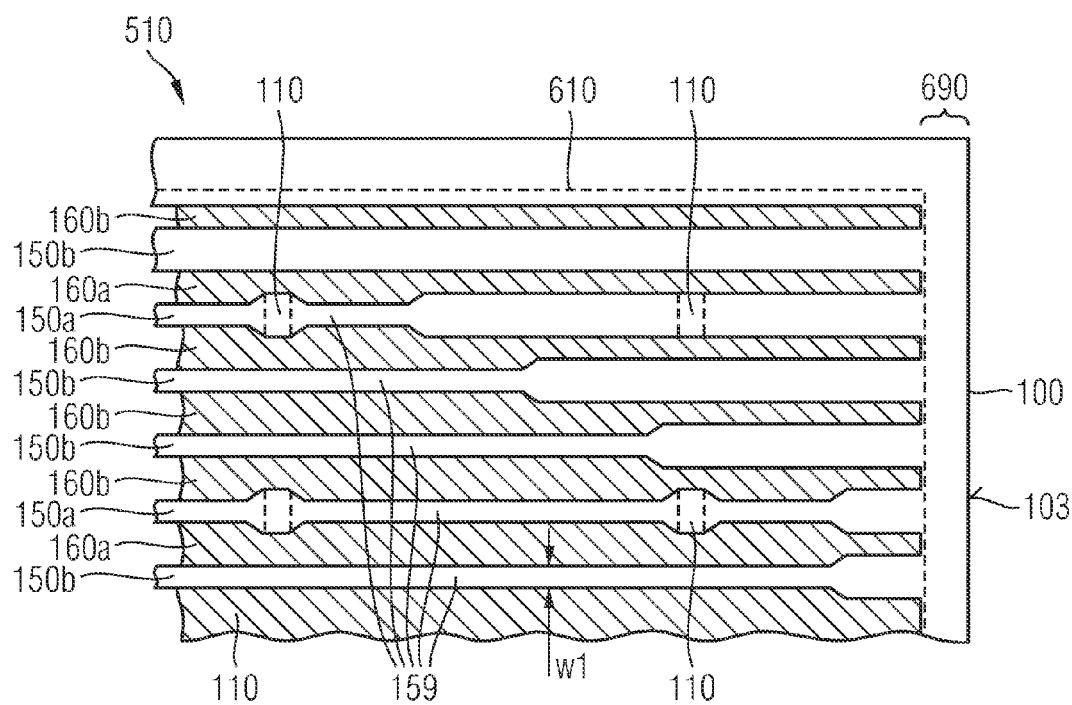
FIG. 13A is a schematic horizontal cross-sectional view of a portion of a semiconductor device according to an embodiment combining different mesa widths.

FIG. 13A shows a horizontal cross-section view of a semiconductor device 510 with the cross-sectional plane cutting through constricted sections 159 of active and passive semiconductor mesas 150a, 150b. The constriction width w1 may change along the same semiconductor mesa 150a, 150b in steps or continuously by at least 10%, for example, by at least 20%. Alternatively or in addition, the constriction width w1 may change from semiconductor mesa 150a, 150b to semiconductor mesa 150a, 150b. According to an embodiment, the pattern of a change of the constriction width w1 may be such that less enhancement cells or more lower effective enhancement cells are formed in a portion of the active area 610 adjoining the edge area 690 than in a central portion of the active area 610 distant to the edge area 690. The active semiconductor mesas 150a including source zones 110 may or may not include constricted sections. For example, the source zones 110 may be arranged in semiconductor mesa portions without constricted section or with comparatively wide constricted section.

Alternatively or in addition, the constriction length of the constricted sections 159 may vary across the active area 610 by at least 10% along a longitudinal extension of at least one of the semiconductor mesas 150a, 150b and/or among the semiconductor mesas 150a, 150b.

A variation of constriction width w1 and/or constriction length may improve the lateral charge carrier distribution, for example with respect to HDR (high dynamic robustness) approaches.

Figure 13B:
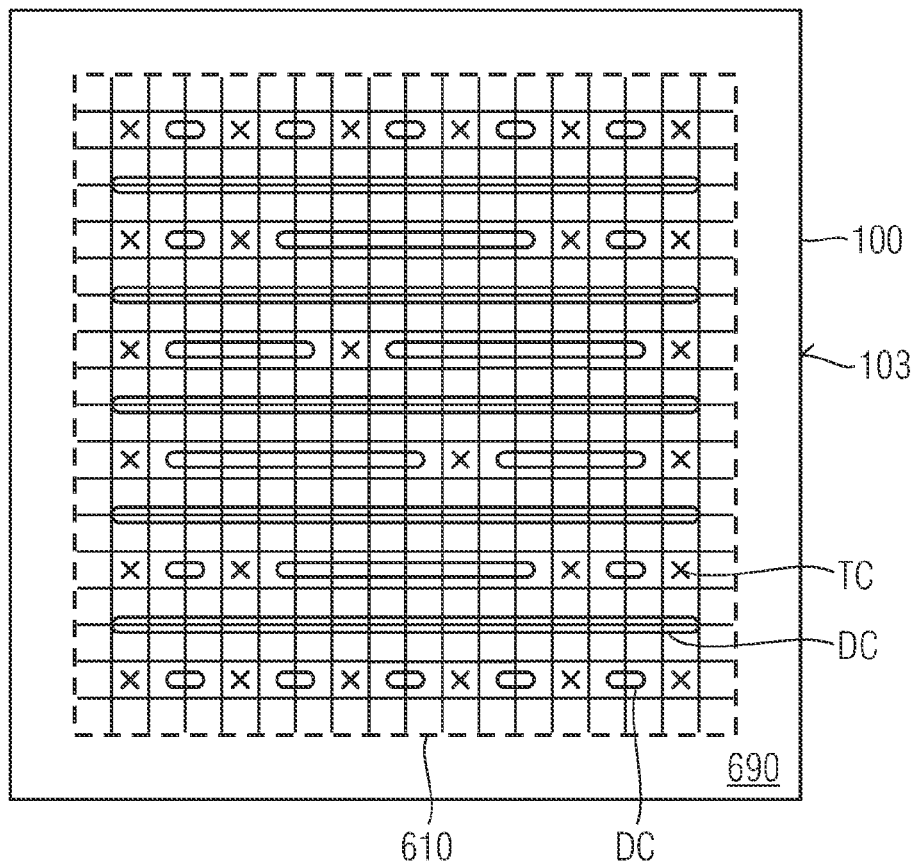
FIG. 13B is a schematic horizontal cross-sectional view of a semiconductor device according to an embodiment related to RC-IGBTs with horizontal variation of transistor cell population density.

FIG. 13B refers to the arrangement of transistor cells TC and diode cells DC in an RC-IGBT 512. All or some of the diode cells DC are enhancement cells with constricted sections. Diode and transistor cells DC, TC may be uniformly distributed in the active area 610. According to an embodiment the population density of the diode cells DC along the edge area 690 is higher than in a central portion to improve the ruggedness of the RC-IGBT 512 in the IGBT mode. According to the illustrated embodiment the population density of the transistor cells TC along the edge area 690 is higher than in a central portion to improve the ruggedness of the RC-IGBT 512 in the reverse conductive mode. In addition the constriction width and length may vary within the active area 610 as discussed with regard to FIG. 13A.

Figure 14A:
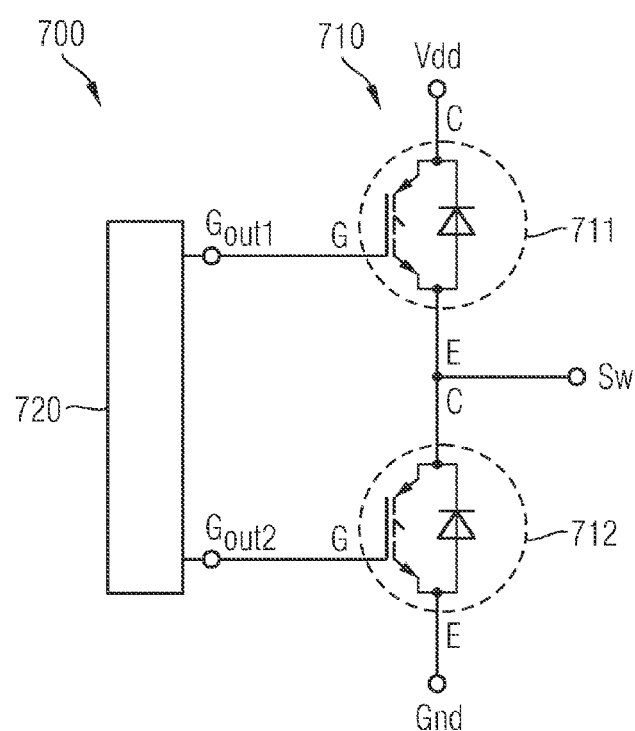
FIG. 14A is a schematic circuit diagram of a half-bridge circuit including two RC-IGBTs based on FIG. 1B according to an embodiment.
Figure 14B:
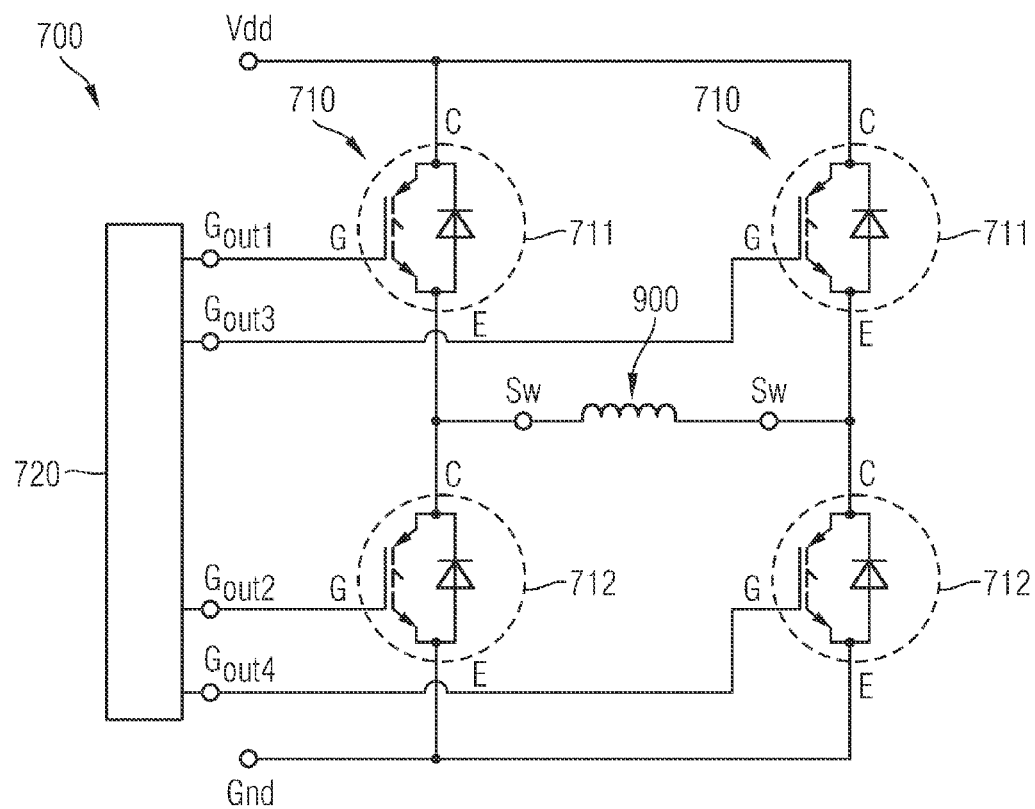
FIG. 14B is a schematic circuit diagram of a full-bridge circuit including two RC-IGBTs based on FIG. 1B according to a further embodiment.

FIGS. 14A to 14B refer to electronic circuits 700 including one or more bridge circuits 710 based on two semiconductor switching devices 711, 712 whose load current paths are connected in series between Vdd and GND. The semiconductor switching devices 711, 712 may be IGBT-FETs or IGBTs. At least one of the semiconductor switching devices 711, 712 may be or may include one of the semiconductor devices 510, 512, 513 of the previous Figures. The half-bridge circuit 710 or the complete electronic circuit 700 may be integrated in a power module.

The electronic circuit 700 may include a gate driver circuit 720 generating and driving a first gate signal at a first driver terminal Gout1 and a second gate signal at a second driver terminal Gout2. The first and second driver terminals Gout1, Gout2 are electrically coupled or connected to gate terminals G of the semiconductor switching devices 711, 712. The gate driver circuit 720 controls the gate signal such that during regular switching cycles the first and second switching devices 711, 712 are alternatingly in the on-state. During desaturation cycles, the gate driver circuit 720 may apply desaturation pulse at a first one of the switching devices 711, 712 before switching the other one of the switching devices 711, 712 into the on-state.

In FIG. 14A the switching devices 711, 712 are re-channel IBGTs with an emitter terminal E of the first switching device 711 and a collector terminal C of the second switching device 712 electrically connected to a switching terminal Sw.

FIG. 14B shows an electronic circuit 700 with two half-bridges 710 whose load paths are connected in parallel and are operated in a full-bridge configuration. A load 900, e.g., an inductive load, may be connected to the switching terminal Sw of the two half-bridges 710. The load 900 may be a motor winding, an inductive cooking plate, or a transformer winding in a switched-mode power supply, by way of example. According to another embodiment, the electronic circuit 700 may include three half-bridges 710 for driving a motor with three windings, wherein each winding is connected between a star node of the motor windings and one of the switching terminals Sw of the half-bridges 710.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a body zone in a semiconductor mesa formed between neighboring control structures that extend from a first surface into a semiconductor body;
    a drift zone forming a first pn junction with the body zone and comprising, in the semiconductor mesa, a first drift zone section that comprises a constricted section of the semiconductor mesa, wherein a minimum horizontal width of the constricted section parallel to the first surface is smaller than a maximum horizontal width of the body zone; and
    an emitter layer between the drift zone and a second surface parallel to the first surface, the emitter layer comprising at least one first zone of a conductivity type of the drift zone.

2. The semiconductor device of claim 1, wherein the minimum horizontal width of the constricted section is smaller than a horizontal width of the first pn junction.

3. The semiconductor device of claim 1, wherein the minimum horizontal width of the constricted section is at most 300 nm.

4. The semiconductor device of claim 1, wherein the minimum horizontal width of the constricted section is at most 80% of the maximum horizontal width of the body zone.

5. The semiconductor device of claim 1, wherein the at least one first zone of the emitter layer forms a contiguous layer of the first conductivity type.

6. The semiconductor device of claim 1, wherein the emitter layer comprises second zones of a conductivity type opposite to the conductivity type of the drift zone between the first zones.

7. The semiconductor device of claim 1, wherein at least one of the control structures is configured to induce an inversion layer in the drift zone along the concerned control structure in an enhanced diode mode and no inversion layer in the drift zone in a desaturation mode.

8. The semiconductor device of claim 7, further comprising:
counter-doped islands embedded in a second drift zone section outside the semiconductor mesa and structurally connected with inversion layers in the drift zone along the control structures in the enhanced diode mode.

9. The semiconductor device of claim 1, wherein
the minimum horizontal width of the constricted section varies along a longitudinal extension of the semiconductor mesa by at least 10%.

10. The semiconductor device of claim 1, comprising:
a plurality of the semiconductor mesas, wherein the minimum horizontal width of the constricted sections varies among the semiconductor mesas by at least 10%.

11. The semiconductor device of claim 1, wherein
a vertical extension of the constricted section is at least 0.5 µm.

12. The semiconductor device of claim 1, wherein
a vertical extension of the constricted section varies by at least 10% along a longitudinal extension of the semiconductor mesa.

13. The semiconductor device of claim 1, comprising:
a plurality of the semiconductor mesas, wherein the vertical extension of the constricted sections varies among the semiconductor mesas by at least 10%.

14. The semiconductor device of claim 1, further comprising:
a transistor cell, wherein in a forward conductive mode charge carriers enter the drift zone through the transistor cell.

15. The semiconductor device of claim 14, wherein
a population density of the transistor cells varies by more than 10% along a line through a horizontal center of the semiconductor body.

16. The semiconductor device of claim 1, further comprising:
a contact structure including a first section in an opening of a dielectric capping layer directly adjoining the first surface and a second section sandwiched between the semiconductor mesa and a control electrode included in one of the neighboring control structures.

17. The semiconductor device of claim 1, wherein
the control structures comprise a dielectric liner separating control electrodes from the semiconductor body, and
the dielectric liner has a greater width along a bottom portion of the control structure opposite to the emitter layer than in sidewall portions adjoining the semiconductor mesas.

18. An electronic circuit, comprising:
a semiconductor device comprising:
a body zone in a semiconductor mesa formed between neighboring control structures that extend from a first surface into a semiconductor body;
a drift zone forming a first pn junction with the body zone and comprising, in the semiconductor mesa, a first drift zone section that comprises a constricted section of the semiconductor mesa, wherein a minimum horizontal width of the constricted section parallel to the first surface is smaller than a maximum horizontal width of the body zone; and
an emitter layer between the drift zone and a second surface parallel to the first surface, the emitter layer comprising at least one first zone of a conductivity type of the drift zone, and
a control circuit having an output electrically coupled to a control electrode formed in the control structures of the semiconductor device, the control circuit configured to output a first control voltage for an enhanced diode mode and a second control voltage for a desaturation mode to the control electrode.

19. A semiconductor device, comprising:
a body zone formed in a semiconductor mesa between neighboring control structures that extend from a first surface into a semiconductor body;
a drift zone forming a first pn junction with the body zone and comprising, in the semiconductor mesa, a first drift zone section that comprises a constricted section of the semiconductor mesa, wherein a minimum horizontal width of the constricted section parallel to the first surface is smaller than a maximum horizontal width of the body zone; and
a source zone separated from the drift zone by the body zone and forming a second pn junction with the body zone, wherein the minimum horizontal width is at most equal to a total width of accumulation layers in the constricted section, and the accumulation layers are formed along the control structures in a forward conductive mode during which charge carriers enter the drift zone through the body zone.

20. The semiconductor device of claim 19, wherein
the accumulation layer is formed along one single of the control structures.

21. The semiconductor device of claim 19, wherein
two accumulation layers are formed along the two neighboring control structures.

22. The semiconductor device of claim 19, wherein
at least one of the control structures includes a portion of a first control electrode electrically connected or coupled to a gate terminal and a field electrode dielectrically insulated from the gate electrode.

23. The semiconductor device of claim 22, further comprising:
a contact structure including a first section in an opening of a dielectric capping layer directly adjoining the first surface and a second section sandwiched between the semiconductor mesa and a field electrode included in one of the neighboring control structures.

* * * * *